(12) United States Patent
Ram

(10) Patent No.: US 10,720,902 B2
(45) Date of Patent: Jul. 21, 2020

(54) SURFACE ACOUSTIC WAVE RFID SENSOR FOR CHEMICAL DETECTION AND (BIO)MOLECULAR DIAGNOSTICS

(71) Applicant: EPITRONIC HOLDINGS PTE. LTD., Singapore (SG)

(72) Inventor: Ayal Ram, Singapore (SG)

(73) Assignee: EPITRONIC HOLDINGS PTE. LTD, Singapore (SG)

(*) Notice: Subject to any disclaimer, the term of this patent is extended or adjusted under 35 U.S.C. 154(b) by 0 days.

(21) Appl. No.: 16/326,175

(22) PCT Filed: Jul. 10, 2017

(86) PCT No.: PCT/IB2017/054141
§ 371 (c)(1),
(2) Date: Feb. 15, 2019

(87) PCT Pub. No.: WO2018/033809
PCT Pub. Date: Feb. 22, 2018

(65) Prior Publication Data
US 2019/0187105 A1    Jun. 20, 2019

Related U.S. Application Data

(60) Provisional application No. 62/375,711, filed on Aug. 16, 2016, provisional application No. 62/375,683,
(Continued)

(51) Int. Cl.
*H03H 9/64*     (2006.01)
*G01N 29/02*    (2006.01)
(Continued)

(52) U.S. Cl.
CPC ............ *H03H 9/642* (2013.01); *G01H 11/08* (2013.01); *G01N 29/00* (2013.01); *G01N 29/022* (2013.01);
(Continued)

(58) Field of Classification Search
CPC ............ G01N 29/2462; G01N 29/022; G01N 2291/0256; G01H 11/08; G10K 11/36;
(Continued)

(56) References Cited

U.S. PATENT DOCUMENTS

2007/0139165 A1    6/2007  Liu
2011/0045600 A1*   2/2011  Ren ..................... G01N 33/004
                                                        436/133
2017/0214381 A1*   7/2017  Bhattacharjee ...... H03H 9/0538

FOREIGN PATENT DOCUMENTS

CN        105424780 A    3/2016

OTHER PUBLICATIONS

Lu et al., "An ovel GaN-based Monolithic SAW IHEMT Oscillator on Silicon", Ultrasonics Symposium (IUS), 2012 IEEE International, IEEE, Oct. 7, 2012 (Oct. 7, 2012), pp. 2206-2209.
(Continued)

*Primary Examiner* — Daniell L Negron
(74) *Attorney, Agent, or Firm* — The Roy Gross Law Firm, LLC; Roy Gross

(57) ABSTRACT

The present application describes embodiments of a radio-frequency identification (RFID) sensor based on a combinationof a surface acoustic wave (SAW) transducer and two-dimensional electron gas (2DEG) or two-dimensional hole gas (2DHG) conducting structure, and its use in chemical detection and (bio)molecular diagnostics. The SAW RFID sensor chip contains apiezoelectric substrate, on which a multilayer heterojunction structure is deposited. The heterojunction structure comprises atleast two layers, a buffer layer and a barrier layer, wherein both layers are grown from III-V single-crystalline or polycrystallinesemiconductor materials, such as GaN/AlGaN. Interdigitated transducers (IDTs) transducing SAWs are installed on top of thebarrier layer. A 2DEG or 2DHG conducting channel is formed at the interface between the buffer and barrier layers
(Continued)

and provideselectron or hole current in the system between the non-ohmic (capacitively-coupled) source and drain contacts connected to the formed channel.

20 Claims, 24 Drawing Sheets
(21 of 24 Drawing Sheet(s) Filed in Color)

Related U.S. Application Data filed on Aug. 16, 2016, provisional application No. 62/375,697, filed on Aug. 16, 2016, provisional application No. 62/375,670, filed on Aug. 16, 2016, provisional application No. 62/375,656, filed on Aug. 16, 2016.

(51) Int. Cl.
| | |
|---|---|
| *G10K 11/36* | (2006.01) |
| *G01H 11/08* | (2006.01) |
| *H01L 29/66* | (2006.01) |
| *H01L 29/778* | (2006.01) |
| *H01L 41/113* | (2006.01) |
| *G01N 29/00* | (2006.01) |
| *H03H 9/02* | (2006.01) |
| *G01N 29/24* | (2006.01) |

(52) U.S. Cl.
CPC ......... *G01N 29/2462* (2013.01); *G10K 11/36* (2013.01); *H01L 29/66462* (2013.01); *H01L 29/7781* (2013.01); *H01L 29/7786* (2013.01); *H01L 41/1132* (2013.01); *H03H 9/02535* (2013.01); *G01N 2291/0256* (2013.01); *G01N 2291/0423* (2013.01)

(58) Field of Classification Search
CPC ........... H01L 29/66462; H01L 29/7786; H01L 41/1132
See application file for complete search history.

(56) References Cited

OTHER PUBLICATIONS

Ryger et al.: "HEMT-SAW structures for chemical gas sensors in harsh environment", Advanced Semiconductor Devices & Microsystems (ASDAM), 2010 8th International Conference on, IEEE, Piscataway, NJ, USA, Oct. 25, 2010, pp. 131-134, XP031834222, ISBN: 978-1-4244-8574-1.
Tsarik et al.: "AIN sensor based on surface acoustic wave with signal amplification by AIN/GaN HEMT", 2015 International Conference on Control, Instrumentation, Communication and Computational Technologies (ICCICCT), IEEE, Dec. 18, 2015, pp. 718-721, XP03290321 O.
International Preliminary Report on Patentability PCT/IB2017/054141 completed Aug. 3, 2018 63 pages.
International Search Report PCT/IB2017/054141 completed Sep. 20, 2017; dated Oct. 11, 2017 4 pages.
Written Opinion of the International Searching Authority PCT/IB2017/054141 dated Oct. 11, 2017 7 pages.
Grajal et al.: "Voltage controlled SAW filters on 2DEG AIGaN/GaN heterostructures", Microwave Symposium Digest, 2004 IEEE MTT-S International Fort Worth, TX, USA Jun. 6-11, 2004, Iscataway, NJ, USA, IEEE, vol. 1, Jun. 6, 2004, pp. 387-390, XP010727321, ISBN: 978-0/7803-8331 -9.
Xing et al.: "A novel GaN-based monolithic SAW/HEMT oscillator on silicon", Ultrasonics Symposium (IUS), 2012 IEEE International, IEEE, Oct. 7, 2012, pp. 2206-2209, XP032434136, ISSN: 1948-5719, ISBM: 978-1-4673-4561-3.
Pearton et al.: "Topical Review; GaN-based diodes and transistors for chemical, gas, biological and pressure sensing; Topical Review", Journal of Physics: Condensed Matter, Institute of Physics Publishing, Bristol, GB, vol. 16, No. 29, Jul. 28, 2004, pp. R961-R994, XP020059871, ISSN: 0953-8984.

* cited by examiner $V_G \gg V_T$ $V_G = 0$
$V_G > V_T$ $V_G \ll V_T$

Fig. 4    Ga-Face Polarity
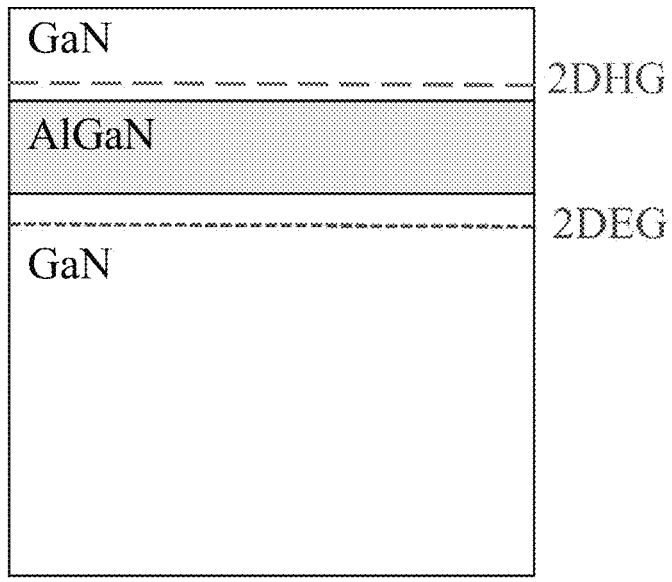
Fig. 5    N-Face Polarity
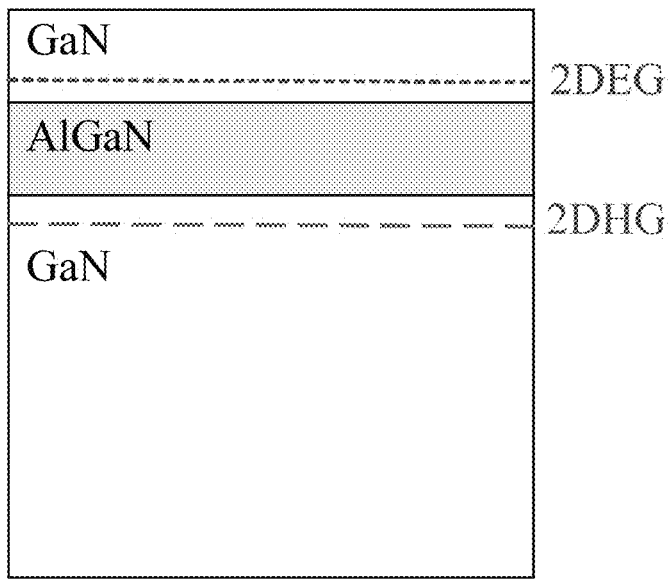

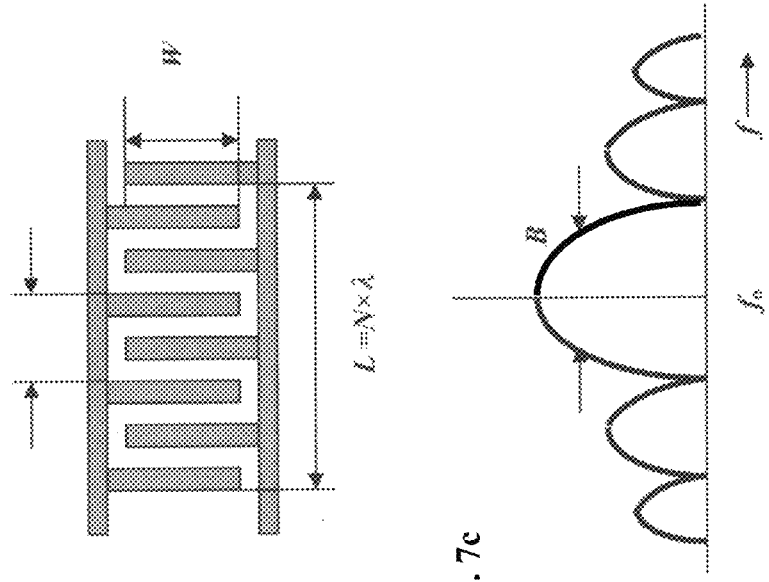
Fig. 7b
Fig. 7c
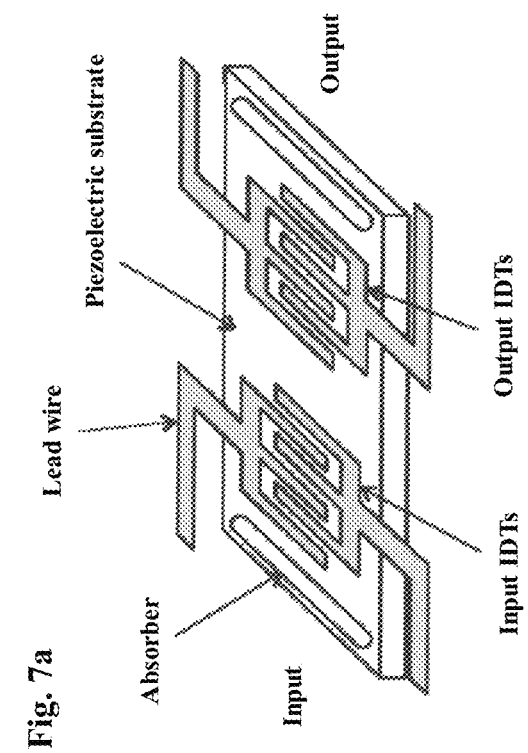
Fig. 7a

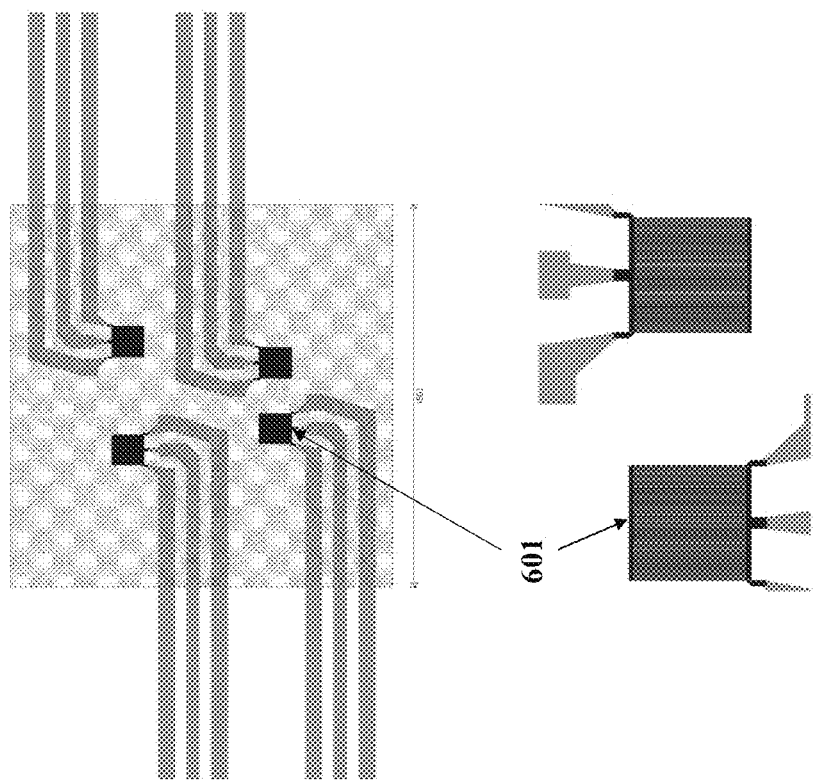
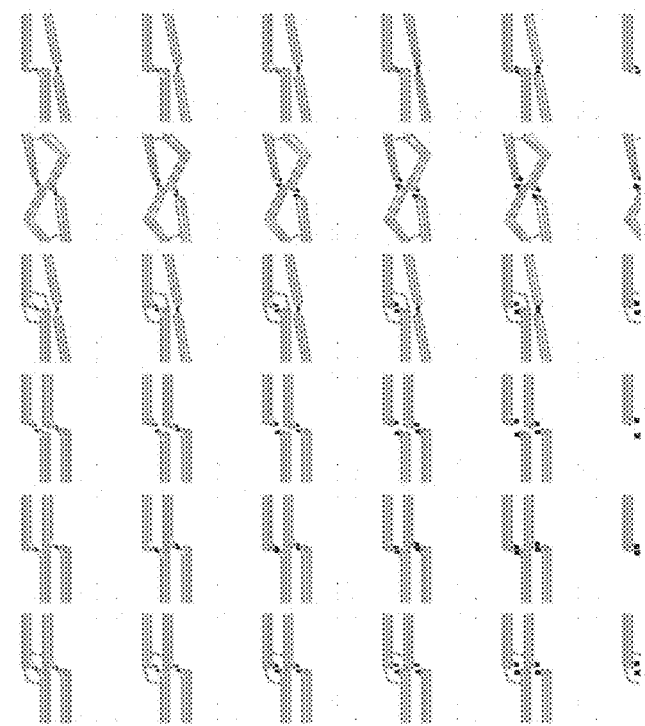
Fig. 18

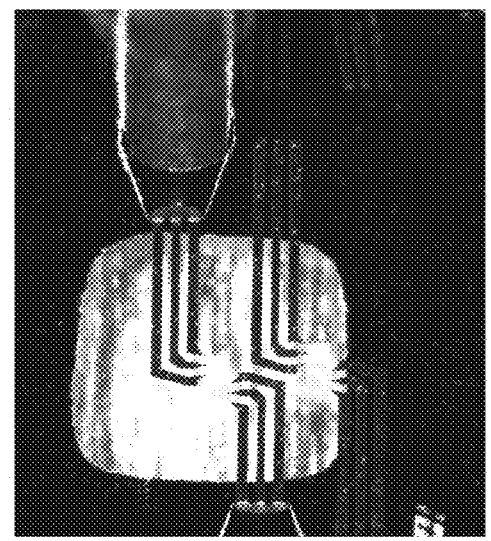
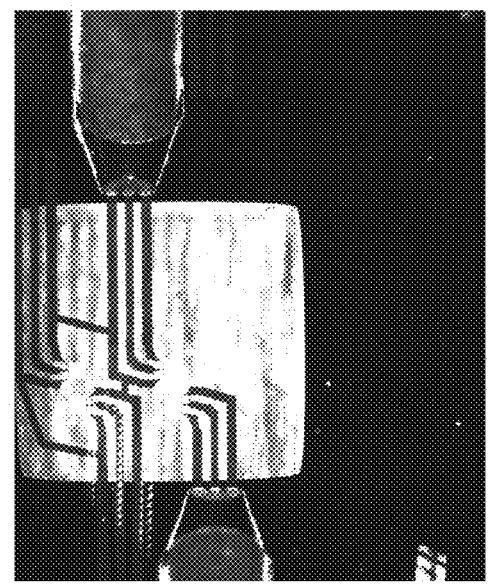
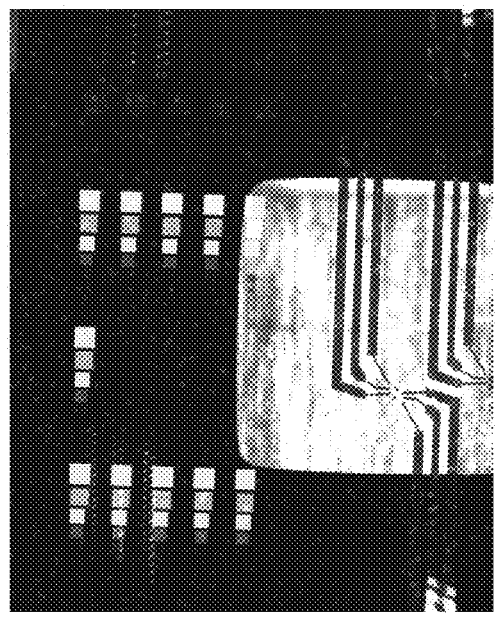
Fig. 20

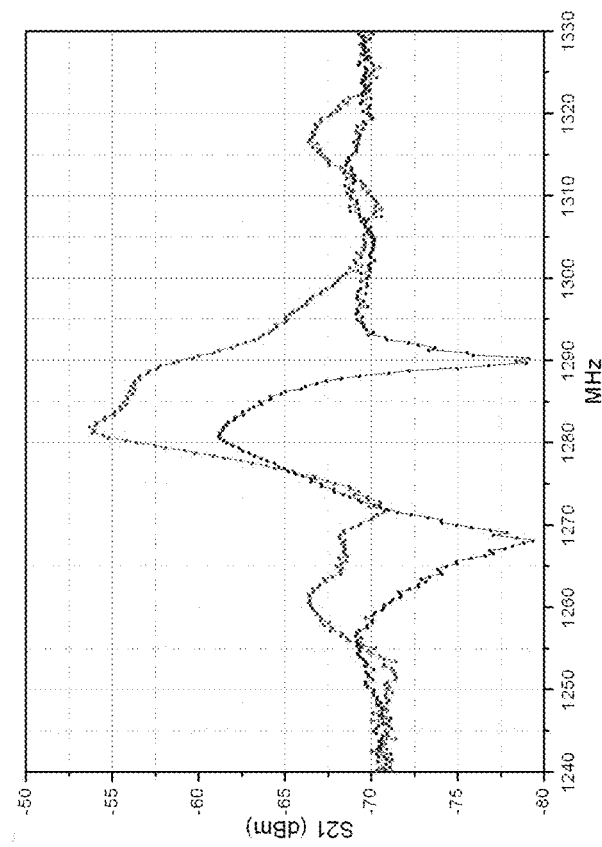
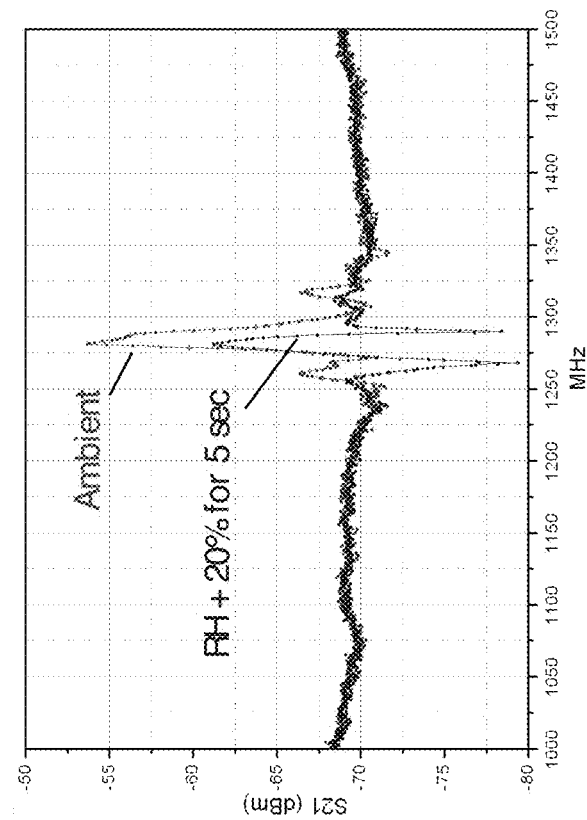
Fig. 21

SURFACE ACOUSTIC WAVE RFID SENSOR FOR CHEMICAL DETECTION AND (BIO)MOLECULAR DIAGNOSTICS

RELATED APPLICATIONS

This application is a National Phase of PCT Patent Application No. PCT/IB2017/054141 having International filing date of Jul. 10, 2017, which claims the benefit of priority of U.S. Provisional Application Nos. 62/375,711, 62/375,683, 62/375,697, 62/375,670, and 62/375,656, all filed on Aug. 16, 2016. The contents of the above applications are all incorporated by reference as if fully set forth herein in their entirety.

TECHNICAL FIELD

In general, the present application relates to the field of electronic sensors based on surface acoustic wave (SAW) transducers. In particular, the present application relates to the GaN/AlGaN-based zero-power SAW RFID sensor and its use in chemical detection and (bio)molecular diagnostics.

BACKGROUND

Chemical sensing is likely the most primordial sensory modality that emerged in the evolution of life. Without chemical sensing life on earth would probably not exist. It is used for detecting nutrients, avoiding threats, finding mating partners and various forms of communication and social interaction between animals.

The advent of artificial sensors has created a myriad of problems in the areas of chemical detection and identification with applications in food quality and pollution control, chemical threat detection, health monitoring, robot control and even odour and taste synthesis. Efficient algorithms are needed to address many challenges of chemical sensing in these areas, including (but not limited to) sensitivity levels, sensor drift, concentration invariance of analyte identity and complex mixtures.

As an example, biological pathogens, including biological threat agents, are living organisms that reproduce and sustain a population, which amplify, grow and re-infect, thereby resulting in an epidemic situation. The biological pathogens represent an extremely diverse range of microorganisms, which have no seemingly common attributes other than infecting the human and animal populations. The problem is therefore to detect and identify them at the earliest stage of invasion and at the lowest concentration.

Prior to DNA sequencing, the highest resolution techniques provided only protein and peptide-level structures as targets of analysis and assays. Many of the well-established protocols called for the examination of the size and shape of the pathogens along with the examination of the expressed proteins through biochemical and immunochemical assays. Advances in DNA sequencing technology have made it possible for scientists all over the world to sequence complete microbial genomes rapidly and efficiently. Access to the DNA sequences of entire microbial genomes has recently offered new opportunities to analyse and understand pathogens at the molecular level. Modern DNA sequencing techniques are able to detect pathogens in biological tissues and study variations in gene expression in response to the pathogenic invasion. These responses help in designing novel approaches for microbial pathogen detection and drug development. Identification of certain microbial pathogens as etiologic agents responsible for chronic diseases is leading to new treatments and prevention strategies for these diseases.

Majority of the modern chemical sensors used in pathogen detection are based upon the sequence-based recognition of DNA, structural recognition of pathogens or pathogen biomarkers, or cell-based function. However, the selection of the pathogen biomarkers introduces a serious challenge in the development of the sensors for detection of the biological pathogens. This is because most of the pathogen biomarkers have low selectivity and can distinguish between general classes of microorganisms, but are not able to identify the specific species or strain of organism. For example, calcium dipicolinate is a unique component of endospores. Dipicolinic acid can therefore be used to indicate the presence of endospores, but it cannot be able to distinguish between very dangerous *Bacillus anthracis* spores and other non-toxic *Bacillus* spores. The presence of the DNA as an additional indicator will be able to determine that the unknown material is biological in nature but will not be able to identify its source (unless extensive sequence-based analysis is used). Also cell metabolites are generally common to many different cell types and therefore extremely difficult to use for discrimination between specific microorganisms. In view of the above, there is a long-felt need for new methods and devices to detect and identify biological pathogens.

The use of the ultrasensitive and highly selective microelectronic sensors for the biological pathogen detection is the area that has not been developed yet. The reasons for that are many. Sensor arrays that detect multiple pathogen biomarkers produce a large number of false alarms because of their low selectivity. The concept of sensor arrays has been successfully used in the field of vapour analysis. In this approach each particular sensor of the sensor array was designed to respond to different properties of the vapours, followed by statistical methods to specifically identify the particular vapour from the fingerprint of the generated response from all the sensors of the array. However, since each pathogen species carries with it a unique DNA or RNA signature that differentiate it from other organisms, such approach cannot be effectively used for pathogen detection. In other words, each sensor of the array responds to different properties (biomarkers) of a pathogen. Therefore, such approach would require a well-characterised and already identified background signal to determine the fingerprints that would constitute a positive signal.

The ideal solution for a real-time sensing would be any specific response of a biological organism that results in instantaneous, specific and repeatable identification. However, as noted above, there are considerable technological and practical difficulties in the development of sensors that provide a real-time response for all three of these criteria. Immuno-assay techniques might give a similar specific analysis. However, their drawback, other than the long response time, is the requirement for special chemical consumables that add considerably to the logistic burden and costs. These can increase operational costs by hundreds of dollars per hour.

Optical technologies intrinsically result in real-time (bio) chemical detection. Sensors based on these technologies have been available to military and civil defence for quite some time. However, the common drawback of the optical sensors is low specificity. The sensors mostly offer a generic detection capability at best, since the optical similarity of the target particles with benign, naturally occurring backgrounds makes them difficult to distinguish. There are the some of the currently employed bio-agent detections strategies. Most represent a compromise between specificity, speed and cost.

Quantitative Polymerase Chain Reaction (qPCR) is capable of amplification and detection of a DNA sample from a single bio-agent cell within 30 minutes. Knowing the pathogen nucleic acid sequence makes it possible to construct oligos for pathogen detection. These oligos are at the basis of many highly specific analytical tests now on the market.

Microarray-based detection can combine powerful nucleic acid amplification strategies with the massive screening capability of microarray technology, resulting in a high level of sensitivity, specificity, and throughput. In addition to the previously mentioned caveats, the cost and organizational complexity of performing a large number of PCR reactions for downstream microarray applications render this option feasible but unattractive. This limitation has severely reduced the utility of this technique and impeded the continued development of downstream applications.

To sum up, the problem of accurate and reliable identification of pathogenic agents and their corresponding diseases is the weakest point in biological agent detection capability today. There is intense research for new molecular detection technologies that could be used for very accurate detection of pathogens that would be a concern to first responders. These include the need for ultrasensitive and highly selective sensors for biological pathogens detection in environmental, forensic and military applications. The benefits of specific (accurate) detection include saving millions of dollars annually by reducing disruption of the workforce and the national economy and improving delivery of correct protective countermeasures.

All said above regarding detection of biological pathogens also relate to the detection of other chemical and biological compounds, which may present threat or have medical reasons to be detected. The examples are many and may include explosives, toxins, DNA, proteins etc.

Surface acoustic-wave (SAW) sensors play an important role in many fields of chemical and biomolecular sensing. In general, a surface acoustic wave is an acoustic wave that propagates along the surface of a certain (piezoelectric) material. It is generated by interdigitated transducer (IDT) electrodes (or "fingers"), which are special periodic metallic bars deposited on a piezoelectric material. When any sinusoidal wave having a period equal to the period of the IDT electrodes is applied, mechanical vibration occurs beneath the IDT electrodes, thereby generating an acoustic wave, which is perpendicular to the geometry of the IDT bars. This acoustic wave propagates on the surface of the piezoelectric material away from the IDT electrodes in both directions.

The acoustic wave generated by the IDTs is localised in the surface region and penetrates the bulk piezoelectric material only to a wavelength deep region. That is why the SAW has a very high energy density at the surface, which gives the name "surface acoustic wave". The SAW propagates in a piezoelectric material approximately $10^5$ times slower than a regular electromagnetic wave. Consequently, the SAW wavelength in the piezoelectric material is $10^5$ times smaller than the wavelength of an electromagnetic wave, making the SAW-based sensor a very compact device.

Fabrication of the SAW sensors requires either deposition or etching of the metallic IDTs on a piezoelectric material, and it uses the CMOS process technology, which allows a large scale manufacture.

The factors that can affect the piezoelectric material surface condition include pressure, temperature, humidity and mass loading. Accordingly, SAW sensors can be used as pressure, temperature, humidity sensors, and as sensors capable of detecting mass changes or electric field alterations at the surface. A MEMS-CMOS technology facilitates the integration of the SAW sensors and their data processing circuits. If a chemical or (bio)molecular layer sensitive to a certain chemical or biological target molecule is deposited at the delay line area of the SAW sensor, it allows this specific chemical or biological target molecule or analyte to react with the sensitive layer and consequently, to be bound at the delay line area. As a result, a mass change and/or electric field change is normally observed and the density of the target chemical or biological molecule (analyte) can be detected and further correlated to its concentration. Thus, the SAW sensors can be used as (bio)chemical molecular sensing devices, which is the subject of the present application.

Specially designed SAW sensors can also be used in a passive mode without need for batteries. An RFID antenna can be added to the input IDT electrode and the signal received by the antenna can then stimulate the SAW used for sensing as mentioned before. These are the zero-power SAW sensors which uses the RFID tag. The ultrahigh sensitivity, compact nature, ease of fabrication and wireless operation make these sensors very attractive for (bio)chemical detection and biomolecular diagnostics.

Penza et al (1998) (M. Penza, E. Milella, V. I. Anisimkin, "*Monitoring of $NH_3$ gas by LB polypyrrole-based SAW sensor*", Sensors and Actuators B: Chemical, 1998, 47(1-3), p. 218) described a SAW-based sensor that shows high sensitivity and selectivity towards gases, such as $NH_3$, CO, $CH_4$, $H_2$ and $O_2$ at room temperature by depositing polypyrrole films on the SAW surface as gas absorbent layers.

Lim et al (2011) (C. Lim, W. Wang, S. Yang, "*Development of SAW-based multi-gas sensor for simultaneous detection of $CO_2$ and $NO_2$*", Sensors and Actuators B: Chemical, 2011, 154(1), p. 9) disclosed a reflective delay line SAW sensor that can measure $CO_2$, $NO_2$ and temperature simultaneously. By taking advantage of a zero-power technology in the SAW sensor, the sensor is operated without a battery, and the sensing of $NO_2$, $CO_2$ and temperature can be done simultaneously.

Raj et al (2013) (V. B. Raj, H. Singh, A. T. Nimal, "*Oxide thin films (ZnO, $TeO_2$, $SnO_2$ and $TiO_2$) based surface acoustic wave (SAW) E-nose for the detection of chemical warfare agents*", Sensors and Actuators B: Chemical, 2013, 178, p. 636) suggested sensing of chemical warfare agents using the SAW-based sensors with ZnO, $TeO_2$, $SnO_2$ and $TiO_2$ deposited for the detection of dimethyl methylphosphonate, dibutyl sulfide, chloroethyl phenyl sulfide and diethyl chlorophosphate, respectively.

Cai et al (2105) (H. L. Cai, Y. Yang, X. Chen, "*A third-order mode high frequency biosensor with atomic resolution*", Biosensors and Bioelectronics, 2015, 71, p. 261) described the SAW-based sensor used to detect DNA sequences and cells. The probe DNA and target DNA were attached to the surface and the resulting frequency change of the SAW resonator was measured.

Zhang et al (2015) (F. Zhang, S. Li, K. Cao, "*A microfluidic love-wave biosensing device for PSA detection based on an aptamer beacon probe*", Sensors, 2015, 15(6), p. 13839) disclosed a prostate specific antigen (PSA) sensor. In this sensor, lithium tantalate ($LiTaO_3$) with aluminium IDTs were coated with a wave guiding layer of silica, followed by deposition of a gold sensing layer for PSA attachment.

Subsequently, a microfluidic channel was fabricated using PDMS to ensure that liquid can flow between the IDTs.

SUMMARY

The present application describes embodiments of a microelectronic sensor or sensor chip based on a combination of a two-dimensional electron gas (2DEG) or two-dimensional hole gas (2DHG) conducting structure and surface acoustic wave (SAW) transducer. In one embodiment, the sensor contains a piezoelectric substrate, on which a multilayer heterojunction structure is deposited. This heterojunction structure comprises at least two layers, a buffer layer and a barrier layer, wherein both layers are grown from III-V single-crystalline or polycrystalline semiconductor materials. Interdigitated transducers (IDTs) transducing surface acoustic waves are installed on top of the barrier layer.

A conducting channel comprising a two-dimensional electron gas (2DEG) or a two-dimensional hole gas (2DHG) is formed at the interface between the buffer and barrier layers and provide electron or hole current in the system between source and drain electrodes. In a particular embodiment, the heterojunction structure may be a three-layer structure consisting of two buffer layers and one barrier layer squeezed between said buffer layers like in a sandwich. This may lead to formation of the two-dimensional hole gas (2DHG) in the top buffer layer above the barrier layer which results in reversing polarity of the structure. An optional dielectric layer may be deposited on top of the heterojunction structure. The open gate area of the 2DEG/2DHG is formed between the source and drain areas as a result of recessing or growing of the top layer to a specific thickness.

The IDTs may be made from GaN/AlGaN semiconductor materials and from metal turning the IDTs into the 2DEG/2DHG conducting structures. In a particular embodiment, the piezoelectric substrate may be optionally placed on a GaN/AlGaN free-standing membrane resulting in a SAW-FBAR (Film Bulk Acoustic Resonators) configuration, for achieving ultra-sensitivity. In further specific embodiment, the sensor may be based on a regular silicon piezoelectric substrate exposed to the medium being tested. In case of any chemical or (bio)molecular binding event to the surface of the sensor, the piezoelectric GaN/AlGaN stack will be stressed or even deformed, thereby changing the SAW propagation parameters. This is because of the piezoelectric polarization effect within the SAW structures resulting in change of the S21 transfer parameter on the IDT receiver.

The source and drain non-ohmic (i.e. capacitively-coupled) contacts are connected to the 2DEG/2DHG channel and to electrical metallizations, the latter are placed on top of the sensor and connect it to an electric circuit of the sensor. Since the source and drain contacts are non-ohmic, the DC readout cannot be carried out. In order to electrically contact the 2DEG/2DHG channel underneath, about 5-20 nm bellow the metallizations, the AC-frequency regime must be used. In other words, the AC readout or impedance measurements of the electric current flowing through the 2DEG/2DHG-channel should be performed in this particular case. The capacitive coupling of the non-ohmic metal contacts with the 2DEG/2DHG channel is normally induced at the frequency higher than 30 kHz.

In a specific case of the substrate grown from GaN/AlGaN, it has been experimentally and surprisingly found that the highest sensitivity of the sensor is achieved when thickness of the top recessed layer (GaN buffer layer or AlGaN barrier layer) in the open gate area between the source and drain contacts is 5-9 nm, preferably 6-7 nm, more preferably 6.2-6.4 nm. This recessed layer thickness corresponds to the pseudo-conducting current range between normally-on and normally-off operation mode of the 2DEG/2DHG conducting channel. In addition, surface roughness of the top recessed layer within the open gate area between the source and drain contacts has a roughness of about 0.2 nm or less, preferably 0.1 nm or less, more preferably 0.05 nm. Thus, in some embodiments, the significant features of the piezoelectric substrate are that:

(i) thickness of the top recessed layer (GaN buffer layer or AlGaN barrier layer) in the open gate area between the source and drain contacts is 5-9 nm, preferably 6-7 nm, more preferably 6.2-6.4 nm, which corresponds to the pseudo-conducting current range between normally-on and normally-off operation mode of the 2DEG/2DHG conducting channel;

(ii) surface roughness of the top recessed layer in the open gate area between the source and drain contacts has a roughness of about 0.2 nm or less, preferably 0.1 nm or less, more preferably 0.05 nm; and (iii) the surface of the piezoelectric substrate in the SAW path area between the IDTs or within the 2DEG/2DHG channel area is coated with a chemical or (bio)molecular layer for sensing.

Further, in some embodiments, the present application provides the zero-power SAW RFID sensor, which is based on the GaN/AlGaN heterostructure, and its use in (bio) chemical detection and (bio)molecular diagnostics. In another embodiment, the sensor is a zero-power sensor remotely powered with the RF-energy and RFID-coded via the orthogonal frequency coding (OFC) method.

Various embodiments may allow various benefits, and may be used in conjunction with various applications. The details of one or more embodiments are set forth in the accompanying figures and the description below. Other features, objects and advantages of the described techniques will be apparent from the description and drawings and from the claims.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

Disclosed embodiments will be understood and appreciated more fully from the following detailed description taken in conjunction with the appended figures. The drawings included and described herein are schematic and are not limiting the scope of the disclosure. It is also noted that in the drawings, the size of some elements may be exaggerated and, therefore, not drawn to scale for illustrative purposes. The dimensions and the relative dimensions do not necessarily correspond to actual reductions to practice of the disclosure.

FIG. 1 schematically shows the quantum well at three different biasing conditions.

FIG. 4 schematically shows the formation of the 2DEG and 2DHG conducting channels in the Ga-face three-layer AlGaN/GaN PC-HEMT structure.

FIG. 5 schematically shows the formation of the 2DEG and 2DHG conducting channels in the N-face three-layer AlGaN/GaN PC-HEMT structure.

FIG. 7a schematically shows the input interdigitated transducer (IDT)-based SAW device.

FIG. 7b schematically shows the IDT and its characteristic parameters: length (L), width (W) and acoustic wavelength (λ).

FIG. 7c shows the bandwidth (B) of the SAW as a function of the number of the IDTs and the frequency (f), where $f_0$ is the centre frequency.

FIG. 18 shows the photolithographic layout masks of the 2DEG-based SAW resonator using the standard configuration with two symmetrical IDT structures (fingers).

FIG. 20 shows the microscope images of the fabricated SAW resonators of FIGS. 18-19 on the free-standing AlGaN/GaN membranes having the unstructured 2DEG with the DRIE-removed Si substrate.

FIG. 21 shows the experimental S21-transfer parameter measured with the sensor of an embodiment using the vector network analyser at SAW resonant frequency of 1280 MHz for the IDT finger having a distance of 700 nm.

DETAILED DESCRIPTION

Figure 1A:
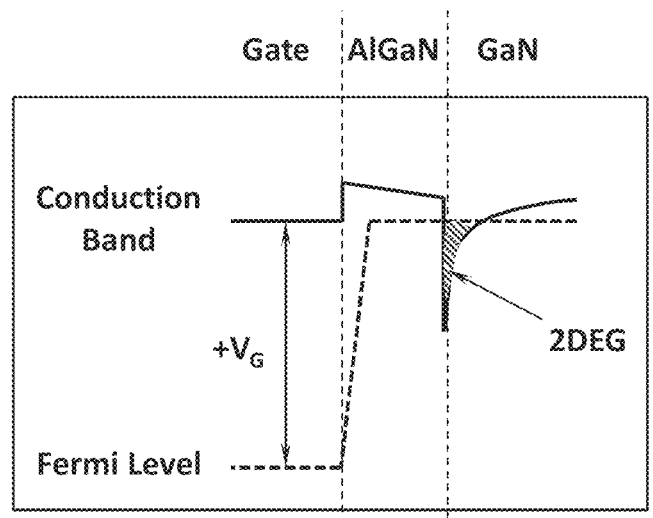
FIG. 1a: positive gate potential ($+V_G$) is much higher than threshold voltage ($V_T$)

In the following description, various aspects of the present application will be described. For purposes of explanation, specific configurations and details are set forth in order to provide a thorough understanding of the present application. However, it will also be apparent to one skilled in the art that the present application may be practiced without the specific details presented herein. Furthermore, well-known features may be omitted or simplified in order not to obscure the present application.

The term "comprising", used in the claims, is "open ended" and means the elements recited, or their equivalent in structure or function, plus any other element or elements which are not recited. It should not be interpreted as being restricted to the means listed thereafter; it does not exclude other elements or steps. It needs to be interpreted as specifying the presence of the stated features, integers, steps or components as referred to, but does not preclude the presence or addition of one or more other features, integers, steps or components, or groups thereof. Thus, the scope of the expression "a device comprising x and z" should not be limited to devices consisting only of components x and z. Also, the scope of the expression "a method comprising the steps x and z" should not be limited to methods consisting only of these steps.

Unless specifically stated, as used herein, the term "about" is understood as within a range of normal tolerance in the art, for example within two standard deviations of the mean. In one embodiment, the term "about" means within 10% of the reported numerical value of the number with which it is being used, preferably within 5% of the reported numerical value. For example, the term "about" can be immediately understood as within 10%, 9%, 8%, 7%, 6%, 5%, 4%, 3%, 2%, 1%, 0.5%, 0.1%, 0.05%, or 0.01% of the stated value. In other embodiments, the term "about" can mean a higher tolerance of variation depending on for instance the experimental technique used. Said variations of a specified value are understood by the skilled person and are within the context of the present invention. As an illustration, a numerical range of "about 1 to about 5" should be interpreted to include not only the explicitly recited values of about 1 to about 5, but also include individual values and sub-ranges within the indicated range. Thus, included in this numerical range are individual values such as 2, 3, and 4 and sub-ranges, for example from 1-3, from 2-4, and from 3-5, as well as 1, 2, 3, 4, 5, or 6, individually. This same principle applies to ranges reciting only one numerical value as a minimum or a maximum. Unless otherwise clear from context, all numerical values provided herein are modified by the term "about". Other similar terms, such as "substantially", "generally", "up to" and the like are to be construed as modifying a term or value such that it is not an absolute. Such terms will be defined by the circumstances and the terms that they modify as those terms are understood by those of skilled in the art. This includes, at very least, the degree of expected experimental error, technical error and instrumental error for a given experiment, technique or an instrument used to measure a value.

As used herein, the term "and/or" includes any and all combinations of one or more of the associated listed items. Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the specification and relevant art and should not be interpreted in an idealized or overly formal sense unless expressly so defined herein. Well-known functions or constructions may not be described in detail for brevity and/or clarity.

It will be understood that when an element is referred to as being "on", "attached to", "connected to", "coupled with", "contacting", etc., another element, it can be directly on, attached to, connected to, coupled with or contacting the other element or intervening elements may also be present. In contrast, when an element is referred to as being, for example, "directly on", "directly attached to", "directly connected to", "directly coupled" with or "directly contacting" another element, there are no intervening elements present. It will also be appreciated by those of skill in the art that references to a structure or feature that is disposed "adjacent" another feature may have portions that overlap or underlie the adjacent feature.

The polarization doped high-electron-mobility transistor (HEMT) is a field effect transistor (FET) in which two layers of different bandgap and polarisation field are grown upon each other forming the heterojunction structure. In one aspect, the sensor of the present application contains a piezoelectric substrate comprising the HEMT-like multilayer heterojunction structure. This structure is essentially based on at least two layers of III-V semiconductor materials, such as gallium nitride (GaN) and aluminium gallium nitride (AlGaN). As a consequence of the discontinuity in the polarisation field, surface charges are created at the interface between the layers of the heterojunction structure. If the induced surface charge is positive, electrons will tend to compensate the induced charge resulting in the formation of the channel. Since the channel electrons are confined in a quantum well in an infinitely narrow spatial region at the interface between the layers, these electrons are referred to as a two-dimensional electron gas (2DEG). This special confinement of the channel electrons in the quantum well actually grants them two-dimensional features, which strongly enhance their mobility surpassing the bulk mobility of the material in which the electrons are flowing.

Figure 1B:
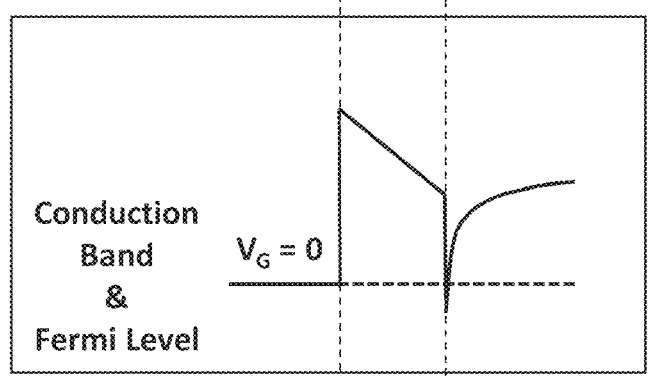
FIG. 1b: 0V gate potential.
Figure 1C:
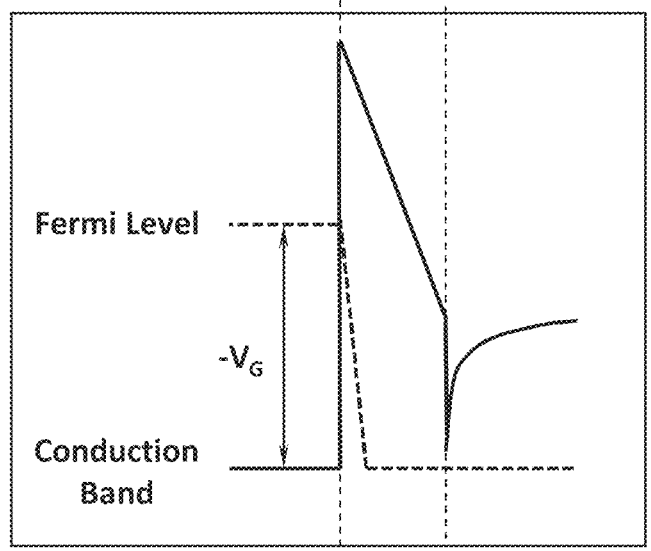
FIG. 1c: negative gate potential ($-V_G$) is below threshold voltage ($V_T$).

FIGS. 1a-1c schematically shows the quantum well at three different biasing conditions starting from the positive gate potential ($V_G$), much higher than the threshold voltage ($V_T$), and going down to the 0V gate potential and further to the negative values below the threshold voltage. The $V_T$ is defined as a voltage, which is required to populate electrons at the interface between the GaN layer and the AlGaN layers, thereby creating conductivity of the 2DEG channel. Since the 2DEG channel electrons occupy energy levels below the Fermi level, the Fermi level in a quantum well is located above several energy levels when $V_G \gg V_T$ (FIG. 1a). This enables high population of channel electrons and consequently, high conductivity. The 2DEG channel is turned on in this case. However, when $V_G$ decreases to 0V (FIG. 1b), the Fermi level also drops with respect to the quantum well. As a result, much fewer electron energy levels are populated and the amount of the 2DEG channel electrons significantly decreases. When $V_G$ much less than $V_T$ (FIG. 1c), all electron energy levels are above the Fermi level, and there is no the 2DEG electrons below the gate. This situation is called "channel depletion", and the channel is turned off.

Many commercially available HEMTs based on the layers of III-V semi-conductor materials have a negative value of $V_T$, resulting in a "normally-on" operation mode at 0V gate potential. They are called "depletion-mode" semiconductor transistors and used in various power switching applications when the negative voltage must be applied on the gate in order to block the current. However, for safe operation at high voltage or high power density, in order to reduce the circuit complexity and eliminate standby power consumption, the transistors with "normally-off" characteristics are preferred. The high voltages and high switching speeds allow smaller, more efficient devices, such as home appliances, communications and automobiles to be manufactured. To control the density of electrons in the 2DEG channel and to switch the HEMT on and off, the voltage at the gate of the transistor is normally regulated.

Several techniques to manufacture the normally-off semiconductor structures have been reported. Burnham et al (2010) proposed normally-off structures of the recessed gate type. In this structure, the AlGaN barrier layer is etched and the gate is brought closer to the interface between the AlGaN barrier layer and the GaN buffer layer. As the gate approaches the interface between the layers, the $V_T$ increases. Thus, the normally-off operation of the 2DEG conducting channel is achieved once the depletion region reaches the interface and depletes the 2DEG channel at zero gate voltage. The major advantages of these structures are relatively lower power consumption, lower noise and simpler drive circuits. They are currently used, for example, in microwave and millimetre wave communications, imaging and radars.

Chang et al (2009) proposed instead of etching the relatively thick barrier layer to approach the AlGaN/GaN interface, to use a very thin AlGaN barrier. This structure also achieves the normally-off operation of the 2DEG channel by approaching the gate towards the AlGaN/GaN interface. Chen et al (2010) proposed to use the fluorine-based plasma treatment method. Although many publications have adopted various methods to achieve normally-off devices with minimum impact on the drain current, they unfortunately sacrificed device turn-on performance.

Figure 2:
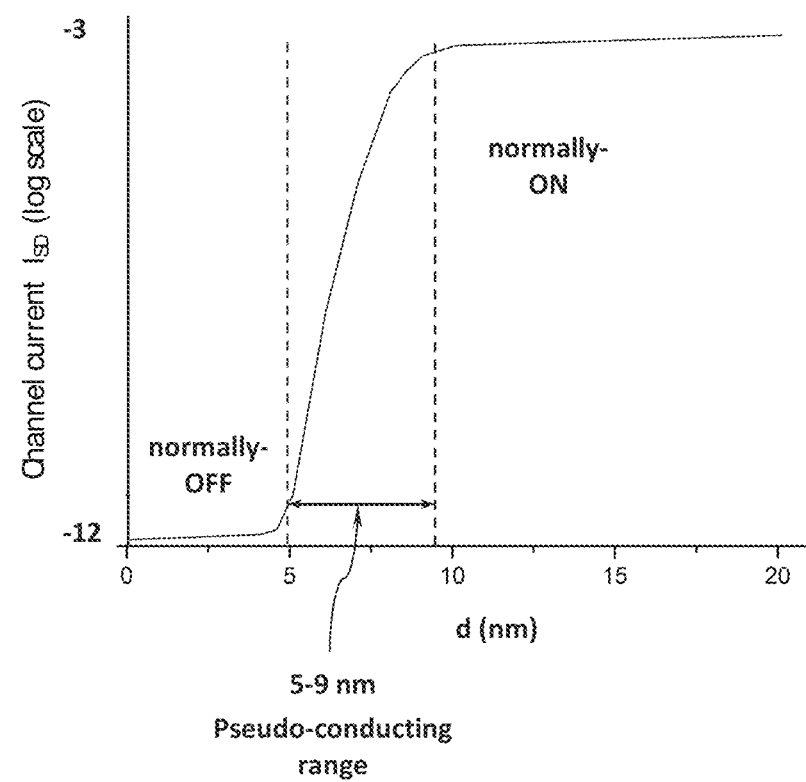
FIG. 2 schematically shows the dependence of the source-drain current (a charge carrier density) induced inside the 2DEG channel of a GaN/AlGaN HEMT on the thickness of the AlGaN barrier layer recessed in the open gate area.

FIG. 2 shows the dependence of the source-drain current (a charge carrier density) on the recessed barrier layer thickness. As seen from the plot, structures that have a thickness of the barrier layer larger than 9 nm form normally-on 2DEG channels. In such structures, due to the inherent polarisation effects present in the III-V materials, a thin sheet of charges is induced at the top and bottom of the interfaces of the barrier layer. As a result, a high electric field is induced in the barrier layer, and surface donor states at the top interface start donating electrons to form the 2DEG channel at the proximity of the hetero-junction interface without the application of a gate bias. These structures therefore constitute normally-on devices. On the other hand, the structures that have a thickness of the barrier layer lower than about 5 nm constitute normally-off devices.

The present application describes embodiments of a microelectronic sensor or sensor chip based on a combination of a two-dimensional electron gas (2DEG) or two-dimensional hole gas (2DHG) structure and surface acoustic wave (SAW) transducer. In some embodiments, the sensor of the embodiments contains a piezoelectric substrate, on which the multilayer heterojunction structure is deposited. This heterojunction structure comprises at least two layers, a buffer layer and a barrier layer, wherein both layers are grown from the aforementioned III-V single-crystalline or polycrystalline semiconductor materials. Interdigitated transducers (IDTs) transducing surface acoustic waves are installed on top of the barrier layer.

In some embodiments, the multilayer heterojunction structure of the present application may be grown from any available III-V single-crystalline or polycrystalline semiconductor materials, such as GaN/AlGaN, GaN/AlN, GaN/InN, GaN/InAlN, InN/InAlN, GaN/InAlGaN, GaAs/AlGaAs and LaAlO$_3$/SrTiO$_3$. In a specific case of the substrate grown from GaN/AlGaN, it has been experimentally found that the highest sensitivity of the sensor is achieved when thickness of the top recessed layer (GaN buffer layer or AlGaN barrier layer) in the open gate area between the source and drain contacts is 5-9 nm, preferably 6-7 nm, more preferably 6.2-6.4 nm. In addition, it was also found that the sensor exhibits its highest sensitivity when surface roughness of the top recessed layer is about 0.2 nm or less, preferably 0.1 nm or less, more preferably 0.05 nm.

Thus, the top layer recessed or grown in the open gate area to 5-9 nm must be optimised for significantly enhancing sensitivity of the sensor. This specific thickness of the barrier layer was surprisingly found to correspond to the "pseudo-conducting" current range between normally-on and normally-off operation modes of the 2DEG channel and requires further explanation.

"Pseudo-contacting" (to distinguish from normally-conducting) current range of the 2DEG channel is defined as an operation range of the channel between its normally-on and normally-off operation modes. "Trap states" are states in the band-gap of a semiconductor which trap a carrier until it recombines. "Surface states" are states caused by surface reconstruction of the local crystal due to surface tension caused by some crystal defects, dislocations, or the presence of impurities. Such surface reconstruction often creates "surface trap states" corresponding to a surface recombination velocity.

Classification of the surface trap states depends on the relative position of their energy level inside the band gap. The surface trap states with energy above the Fermi level are acceptor-like, attaining negative charge when occupied. However, the surface trap states with energy below the Fermi level are donor-like, positively charged when empty and neutral when occupied. These donor-like surface trap states are considered to be the source of electrons in the formation of the 2DEG channel. They may possess a wide distribution of ionization energies within the band gap and are caused by redox reactions, dangling bonds and vacancies in the surface layer. A balance always exists between the 2DEG channel density and the number of ionised surface donors which is governed by charge neutrality and continuity of the electric field at the interfaces.

Thus, the donor-like surface traps at the surface of the barrier layer are one of the most important sources of the 2DEG in the channel. However, this only applies for a specific barrier layer thickness. In a relatively thin barrier layer, the surface trap state is below the Fermi level. However, as the barrier layer thickness increases, the energy of the surface trap state approaches the Fermi energy until it coincides with it. The thickness of the barrier layer corresponding to such situation is defined as "critical". At this point, electrons filling the surface trap state are pulled to the channel by the strong polarisation-induced electric field found in the barrier to form the 2DEG instantly.

If the surface trap states are completely depleted, further increase in the barrier layer thickness will not increase the 2DEG density. Actually, if the 2DEG channel layer fails to stretch the barrier layer, the later will simply relax. Upon relaxation of the barrier layer, many crystal defects are created at the interface between the buffer and barrier layers, and the piezoelectric polarisation instantly disappears causing deterioration in the 2DEG density.

Figure 3:
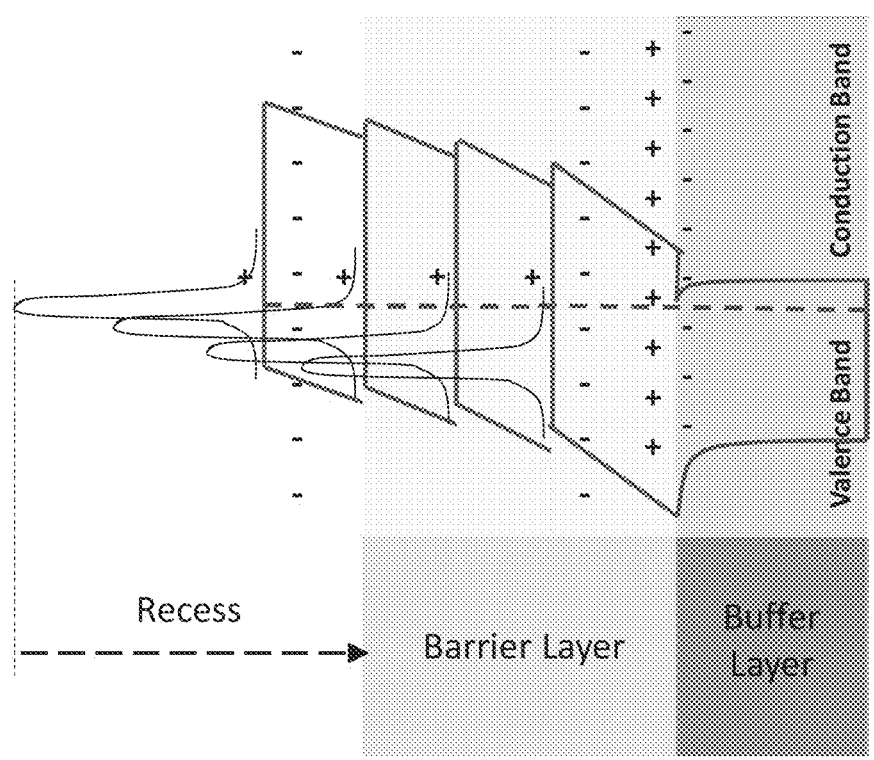
FIG. 3 illustrates a theory behind the 2DEG formation (charge neutrality combined with the lowest energy level) at the conduction band discontinuity.

In order to illustrate the above phenomenon of the pseudo-conducting current, reference is now made to FIGS. 2 and 3. As described above, FIG. 2 shows the dependence of the source-drain current (a charge carrier density) on the recessed AlGaN barrier layer thickness. Energy equilibrium between the donor surface trap states and AlGaN tunnel barrier leads to the 2DEG formation (charge neutrality combined with the lowest energy level) at the conduction band discontinuity. As explained above, decrease in the thickness of the barrier layer results in increase of the energy barrier. As a result, the ionisable donor-like surface trap states, which are responsible for electron tunneling from the surface to 2DEG, drift bellow the Fermi level, thereby minimizing the electron supply to the 2DEG channel. This theoretical situation is further illustrated in FIG. 3. Therefore, the recess of the AlGaN layer from 9 nm to 5 nm leads to huge drop in conductivity of the two-dimensional electron gas for six orders of magnitude.

Thus, the mechanism of the 2DEG depletion based on recessing the barrier layer is strongly dependent on the donor-like surface trap states (or total surface charge). As the thickness of the barrier layer decreases, less additional external charge is needed to apply to the barrier layer surface in order to deplete the 2DEG channel. There is a critical (smallest) barrier thickness, when the 2DEG channel is mostly depleted but still highly conductive due to a combination of the energy barrier and the donor surface trap states energy. At this critical thickness, even the smallest energy shift at the surface via any external influence, for example an acoustic wave propagating along the surface, leads immediately to the very strong 2DEG depletion. As a result, the surface of the barrier layer at this critical thickness is extremely sensitive to any smallest change in the electrical field of the surroundings.

Thus, recess of the barrier layer from 9 nm down to 5 nm significantly reduced the 2DEG density, brought the sensor to the "near threshold" operation and resulted in highly increased surface charge sensitivity. The specific 5-9 nm thickness of the barrier layer responsible for the pseudo-conducting behaviour of the 2DEG channel gives the sensor an incredible sensitivity.

In addition to the recessed or grown top barrier layer thickness, roughness of the barrier layer surface is another very important parameter that has not been previously disclosed. It has been surprisingly found that the roughness of the AlGaN barrier layer surface bellow 0.2 nm prevents scattering of the donor-like surface trap states.

Thus, combination of these two features: 5-9 nm thickness of the AlGaN barrier layer and strongly reduced roughness of its surface make the sensor incredibly sensitive.

In a further aspect, the hetero-junction structure may be a three-layer structure consisting of two buffer layers and one barrier layer squeezed between said buffer layers like in a sandwich, wherein the top layer is a buffer layer. This may lead to formation of the two-dimensional hole gas (2DHG) in the top buffer layer above the barrier layer which results in reversing polarity of the transistor compared to the two-layer structure discussed above.

In general, polarity of III-V nitride semiconductor materials strongly affects the performance of the transistors based on these semiconductors. The quality of the wurtzite GaN materials can be varied by their polarity, because both the incorporation of impurities and the formation of defects are related to the growth mechanism, which in turn depends on surface polarity. The occurrence of the 2DEG/2DHG and the optical properties of the hetero-junction structures of nitride-based materials are influenced by the internal field effects caused by spontaneous and piezo-electric polarizations. Devices in all of the III-V nitride materials are fabricated on polar {0001} surfaces. Consequently, their characteristics depend on whether the GaN layers exhibit Ga-face positive polarity or N-face negative polarity. In other words, as a result of the wurtzite GaN materials polarity, any GaN layer has two surfaces with different polarities, a Ga-polar surface and an N-polar surface. A Ga-polar surface is defined herein as a surface terminating on a layer of Ga atoms, each of which has one unoccupied bond normal to the surface. Each surface Ga atom is bonded to three N atoms in the direction away from the surface. In contrast, an N-polar surface is defined as a surface terminating on a layer of N atoms, each of which has one unoccupied bond normal to the surface. Each surface N atom is also bonded to three Ga atoms in the direction away from the surface. Thus, the N-face polarity structures have the reverse polarity to the Ga-face polarity structures.

As described above for the two-layer heterojunction structure, the barrier layer is always placed on top of the buffer layer. The layer which is therefore recessed is the barrier layer, specifically the AlGaN layer. As a result, since the 2DEG is used as the conducting channel and this conducting channel is located slightly below the barrier layer (in a thicker region of the GaN buffer layer), the hetero junction structure is grown along the {0001}-direction or, in other words, with the Ga-face polarity. However, as explained above, the physical mechanism that leads to the formation of the 2DEG is a polarisation discontinuity at the AlGaN/GaN interface, reflected by the formation of the polarisation-induced fixed interface charges that attract free carriers to form a two-dimensional carrier gas. It is a positive polarisation charge at the AlGaN/GaN interface that attracts electrons to form 2DEG in the GaN layer slightly below this interface.

As noted above, polarity of the interface charges depends on the crystal lattice orientation of the hetero-junction structure, i.e. Ga-face versus N-face polarity, and the position of the respective AlGaN/GaN interface in the hetero junction structure (above or below the interface). Therefore, different types of the accumulated carriers can be present in the hetero-junction structure of the embodiments.

In case of the three-layer hetero-junction structure, there are four possible configurations:

Ga-Face Polarity
1) The Ga-face polarity is characterised by the 2DEG formation in the GaN layer below the AlGaN barrier layer. This is actually the same two-layer configuration as described above, but with addition of the top GaN layer. In this configuration, the AlGaN barrier layer and two GaN buffer layers must be nominally undoped or n-type doped.
2) In another Ga-face configuration shown in FIG. 4, in order to form the conducting channel comprising a two-dimensional hole gas (2DHG) in the top GaN layer above the AlGaN barrier layer in the configuration, the AlGaN barrier layer should be p-type doped (for example, with Mg or Be as an acceptor) and the GaN buffer layer should be also p-type doped with Mg, Be or intrinsic.

N-Face Polarity
3) The N-face polarity is characterised by the 2DEG formation in the top GaN layer above the AlGaN barrier layer, as shown in FIG. 5. In this case, the AlGaN barrier layer and two GaN buffer layers must be nominally undoped or n-type doped.
4) The last configuration assumes that the 2DHG conducting channel is formed in the buffer GaN layer below the AlGaN barrier layer. The top GaN layer may be present (three-layer structure) or not (two-layer structure) in this case. The AlGaN barrier layer must be p-type doped (for example, with Mg or Be as an acceptor) and the bottom GaN layer should be also p-type doped with Mg, Be or intrinsic.

Thus, there are four hetero-junction three-layer structures implemented in the transistor of the embodiments, based on the above configurations:

A. Ga-Face GaN/AlGaN/GaN heterostructure with the 2DEG formed in the GaN buffer layer below the AlGaN barrier layer. In this case, the top GaN layer may be omitted to obtain the two-layer structure. For the three-layer structure, the top GaN layer must be recessed to 1-9 nm thickness in the open gate area or grown with this low thickness, with the roughness below 0.2 nm, and the thickness of the AlGaN barrier can be adjusted properly during growth B. Ga-Face GaN/AlGaN/GaN heterostructure with the 2DHG conducting channel formed in the top GaN layer above the AlGaN barrier layer. The top GaN layer must be recessed to 5-9 nm thickness in the open gate area with the roughness below 0.2 nm, and the thickness of the AlGaN barrier layer can be adjusted properly. P-type doping concentrations of the GaN layer and AlGaN barrier have to be adjusted; the 2DHG has to be contacted (in the ideal case by ohmic contacts).

C. N-Face GaN/AlGaN/GaN heterostructure with the 2DEG in the top GaN layer above the AlGaN barrier layer. The top GaN layer must be recessed to 5-9 nm thickness in the open gate area with the roughness below 0.2 nm. Thickness of the AlGaN barrier can be adjusted during growth. N-type doping levels of the GaN buffer layer and the AlGaN barrier layer must be adjusted; the 2DEG has to be contacted (in the ideal case by ohmic contacts).

D. N-Face GaN/AlGaN/GaN heterostructure with the 2DHG in the GaN buffer layer below the AlGaN barrier layer. In this case, the top GaN layer may be omitted to obtain the two-layer structure. In both, the two-layer and three-layer configurations, the top GaN layer must be recessed to 1-9 nm thickness in the open gate area with the roughness below 0.2 nm, and the thickness of the AlGaN barrier can be adjusted properly.

Figure 6:
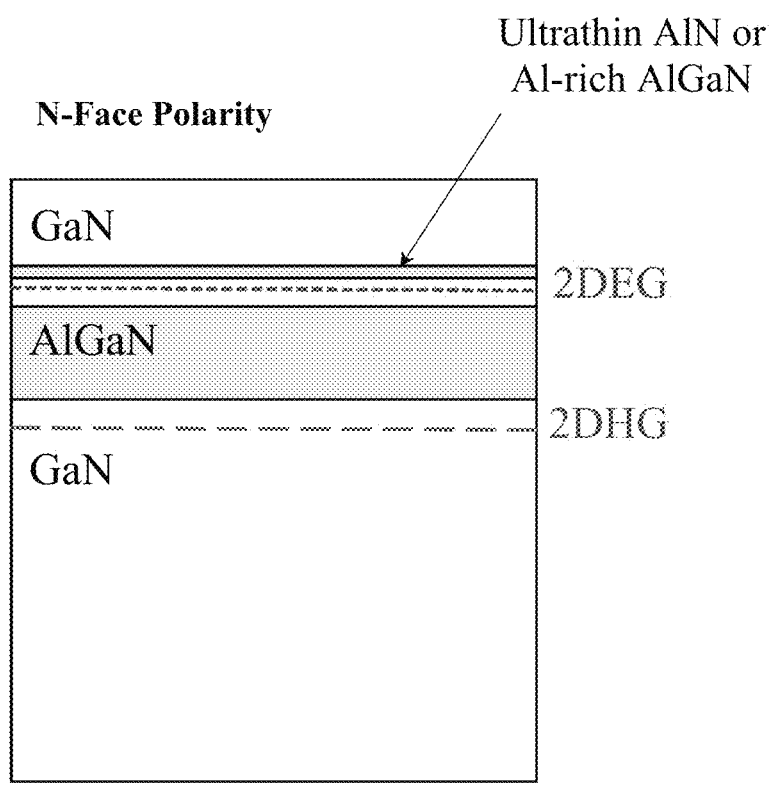
FIG. 6 schematically shows the formation of the 2DEG conducting channel in the N-face three-layer AlGaN/GaN PC-HEMT structure with an ultrathin Al(GaN)N layer for improved confinement.

In all the above structures, the deposition of a dielectric layer on top might be beneficial or even necessary to obtain a better confinement (as in case of the N-face structures). As shown in FIG. 6, for the above "C" structure, it may be even more beneficial to include an ultrathin (about 1 nm) AlN or AlGaN barrier layer with high Al-content on top of the 2DEG channel to improve the confinement.

The preferable structures of the embodiments are structures "B" and "C". In the structure "B", the 2DHG conducting channel formed in the top GaN layer, which has a higher chemical stability (particularly towards surface oxidation) than the AlGaN layer. Concerning the structure "C", the 2DEG conducting channel might be closer to the surface. Therefore, the electron mobility might be lower than in the 2DEG structure with the Ga-face polarity. In general, the polarity of the heterostructure can be adjusted by the choice of the substrate (e.g. C-face SiC) or by the growth conditions.

Another important feature of the sensor of the present application is that an electrical connection of the heterojunction structure to the 2DEG or 2DHG channel is realised via capacitive coupling to the electrical metallizations through a Schottky barrier contact. "Capacitive coupling" is defined as an energy transfer within the same electric circuit or between different electric circuits by means of displacement currents induced by existing electric fields between circuit/s nodes. In general, ohmic contacts are the contacts that follow Ohm's law, meaning that the current flowing through them is directly proportional to the voltage. Non-ohmic contacts however do not follow the same linear relationship of the Ohm's law. In other words, electric current passing through non-ohmic contacts is not linearly proportional to voltage. Instead, it gives a steep curve with an increasing gradient, since the resistance in that case increases as the electric current increases, resulting in increase of the voltage across non-ohmic contacts. This is because electrons carry more energy, and when they collide with atoms in the conducting channel, they transfer more energy creating new high-energy vibrational states, thereby increasing resistance and temperature.

When electrical metallizations are placed over single-crystalline or polycrystalline semiconductor material, the "Schottky contact" or "Schottky barrier contact" between the metal and the semiconductor occurs. Energy of this contact is covered by the Schottky-Mott rule predicting the energy barrier between a metal and a semiconductor to be proportional to the difference of the metal-vacuum work function and semiconductor-vacuum electron affinity. However, this is an ideal theoretical behaviour, while in reality most interfaces between a metal and a semiconductor follow this rule only to some degree. The boundary of a semiconductor crystal abrupt by a metal creates new electron states within its band gap. These new electron states induced by a metal and their occupation push the centre of the band gap to the Fermi level. This phenomenon of shifting the centre of the band gap to the Fermi level as a result of a metal-semiconductor contact is defined as "Fermi level pinning", which differs from one semiconductor to another. If the Fermi level is energetically far from the band edge, the Schottky contact would preferably be formed. However, if the Fermi level is close to the band edge, an ohmic contact would preferably be formed. The Schottky barrier contact is a rectifying non-ohmic contact, which in reality is almost independent of the semi-conductor or metal work functions.

Thus, a non-ohmic contact allows electric current to flow only in one direction with a non-linear current-voltage curve that looks like that of a diode. On the contrary, an ohmic contact allows electric current to flow in both directions roughly equally within normal device operation range, with an almost linear current-voltage relationship that comes close to that of a resistor (hence, "ohmic").

Since the source and drain contacts are non-ohmic (i.e. capacitively-coupled), the DC readout cannot be carried out. To electrically contact the 2DEG/2DHG channel underneath, about 5-20 nm bellow the metallizations, the AC-frequency regime must be used. In other words, the AC readout or impedance measurements of the electric current flowing through the 2DEG/2DHG-channel should be performed in this particular case. The capacitive coupling of the non-ohmic metal contacts with the 2DEG/2DHG channel becomes possible only if sufficiently high AC frequency, higher than 30 kHz, is applied to the metallizations. To sum up, the electrical metallizations, which are capacitively coupled to the 2DEG/2DHG channel utilise the known phenomenon of energy transfer by displacement currents. These displacement currents are induced by existing electrical fields between the electrical metallizations and the 2DEG/2DHG conducting channel operated in the AC frequency mode through the Schottky contact as explained above.

Surface acoustic wave (SAW) resonators are a class of MEMS based on the modulation of surface acoustic waves. The detection mechanism for SAW resonators utilizes changes in the amplitude, velocity, or phase of a SAW propagating along the substrate due to changes to the characteristics of the propagation path. In general, the energy of the SAW is normally concentrated in a surface region with a thickness of less than 1.5 times its wavelength. Therefore, the SAW resonator is extremely sensitive to its environment.

In general, the SAW-based molecular, biomolecular and gas sensors for detecting industrial gas products, chemical warfare agents, nerve gases, and other toxic agents are of great interest for conventional industry, defence industry, security, and environmental supervision. The piezoelectric microbalance or SAW resonators can be used for example for air sensing in electronic chemical noses. A neural network-type pattern recognition approach can be incorporated in the design to provide early warning molecular, biomolecular and gas sensor systems which can be built into mobile vehicles, mobile devices and wearables to detect a range of chemical and biochemical substances in the liquid medium and in external air.

As noted above, the SAW resonators have already been successfully used as gas, temperature, humidity, viscosity and pressure sensors. By using special chemical and bio-chemical coatings on the surface of a SAW resonator, various chemicals, gasses and biomaterials can be detected.

Due to utilization of the well-established technology of GaN-based devices, such as LEDs and HEMTs, combined with short process sequence (in comparison with common silicon-based MEMS), the SAW-sensors are not only relatively cheap, sensitive and reliable, but they also do not need a DC power supply for certain operations, which makes them ideal for autonomous applications.

The principle of the inter-digitated transducer (IDT)-based SAW sensor is shown in FIGS. 7a-7c. Fabrication of the SAW sensors comprises material selection, patterning, dicing, functionalisation and final packaging. The SAW sensors are fabricated from piezoelectric materials, typically quartz. They rely on two IDTs—one to launch and the other to detect a wave that travels from one end of the piezoelectric substrate to the other. A pair of IDTs, fabricated on the GaN/AlGaN substrate, serves as input and output ports of the signals. Each transducer is composed of many pairs of photolithographically defined fingers, and each finger is only a few micrometres wide.

The SAW is extremely sensitive to tiny mass changes and capable of detecting a few as 100 picogram/cm$^2$ amount of analyte, which corresponds to sensitivity of less than 0.01 monolayer of carbon. The velocity and the attenuation of acoustic waves result from changes in surface mass in SAW devices. Measuring both these properties simultaneously helps determine the nature and cause of the sensor response. In general, the SAW sensors are designed by choosing the desired frequency and bandwidth of operation.

The SAW can be expressed as a complex value $\gamma=\alpha+i\beta$, wherein the given or calculated attenuation constant $\alpha$ and propagation constant $\beta=2\pi/\lambda$ are important design parameters of the SAW sensor ($\lambda$ is the acoustic wavelength). Another important design parameter is the electromechanical coupling coefficient $K^2$, which is a measure of the efficiency for converting an applied microwave signal into mechanical energy. These parameters will determine the magnitude of the observed changes in the SAW phase velocity and attenuation of the SAW intensity.

As shown in FIGS. 7b-7c, the operation frequency of the SAW sensor $f_0$ can be chosen by properly choosing the inter-digital finger spacing d such that $f_0=v/d$, where v is the wave propagation velocity in the specific substrate. Consequently, the dimensions of the designed SAW sensor depend on the chosen operating frequency, which can vary from a micrometre for 1-10 GHz to millimetres for kHz-MHz operation. SAW sensors operating in the GHz range can be readily designed and easily integrated with RF, the diverse MMIC, and the microstrip circuits for low power wireless remote sensing. The bandwidth of the acoustic wave is given by $B=v/2Nd$, where N is number of inter-digital fingers, as shown in FIG. 7b.

The aforementioned GaN/AlGaN-based systems are almost ideal materials for the SAW sensors due to their high SAW propagation velocity of about 4000 m/s, high electromechanical coupling coefficients, and their compatibility with the RF electronic integration. These materials also show excellent resistance to humidity and chemical etching. The GaN/AlGaN heterostructures described above exhibit a strong piezoelectric effect and have been used to fabricate the ultra-sensitive SAW-microbalances, exploiting the influence of mass accumulation on the SAW propagation. The high electromechanical coupling coefficients of the GaN/AlGaN substrate ($K^2_{\mathit{eff}}=0.001$-$0.002$), in combination with the low acoustic loss and SAW high velocity, enable their use in high-frequency and diverse low-loss RF applications. Therefore, the GaN/AlGaN-based SAW resonators and sensors operating up to the 10 GHz range can be designed and integrated with any wireless remote sensing applications.

Thus, using the GaN/AlGaN heterostructure as the piezoelectric substrate for the SAW sensors will result in a considerable improvement of the detection limit and in a high selectivity. This is a result of the 2DEG/2DHG's sensitivity to any proximal surface charge and a high mass sensitivity, as explained above. Thus, the GaN/AlGaN hetero-structures and Schottky diodes can be integrated with a SAW sensor to create a rather unique resonant SAW tuning device with low acoustic loss, low loss RF performance and high frequency. The 2DEG/2DHG in a GaN/AlGaN structure and in a SAW propagation path interacts with the lateral electric field, resulting in ohmic loss, which attenuates and slows the SAW. This mechanism can be used to tune the SAW propagation velocity.

However, to combine the 2DEG/2DHG with the SAW achieving a maximal sensory effectiveness, some physical aspects must be taken into account. The actual functional combination of the 2DEG/2DHG with the SAW requires complete or partial removal, depletion or appropriate patterning of the 2DEG/2DHG in the quantum-well channel in the acoustic wave propagation region. The high charge conductivity in the conducting 2DEG/2DHG channel can screen the electric field and reduce the acousto-electric transductions in the IDTs.

The metallic IDTs introduce inherent mass loading effects and triple-transit-interference (TTI), reducing the signal-to-noise ratio. In conventional SAW sensors, the average SAW propagation velocity under the metallic IDTs will be reduced from the free-surface value and will result in a reduction of its centre frequency with an increased amplitude and phase rippling across the bandpass due to signal reflection from the metallic IDTs.

Figure 8:
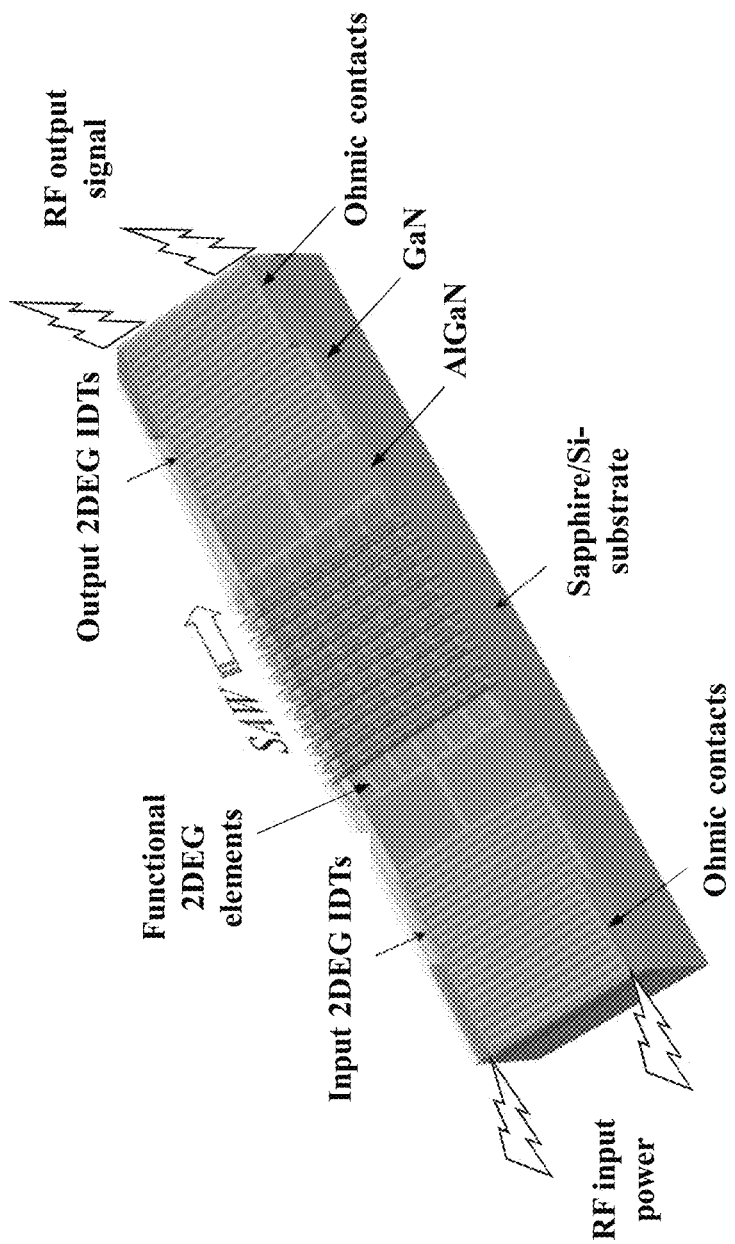
FIG. 8 schematically shows a SAW RFID sensor of an embodiment with 2DEG IDTs on a GaN/AlGaN heterostructure.

The aforementioned problems can be overcome by using the IDT fingers based on the PC-HEMT-like structures whilst also increasing the sensor sensitivity. In that case, the RF characteristics of the SAW device with planar 2DEG/2DHG IDTs are nearly equal to those using metallic IDTs with a Schottky contact. Moreover, the resulting mass-loading effects and the TTI are suppressed when using the 2DEG/2DHG-based transducers instead of the metallic IDTs. Also, the detection area of the SAW sensor or resonator can be right on top of the planar 2DEG/2DHG IDTs rather than in a separate SAW propagation area in between the IDTs. FIG. 8 schematically shows a sensor with such 2DEG/2DHG IDTs on top of a GaN/AlGaN heterostructure.

In general, when the metallic IDTs are placed on a semiconductor material, the Schottky contact is formed between the metal and the semiconductor, as explained above (regarding non-ohmic contacts). Considering the charge sensitivity mechanism in the 2DEG/2DHG-based SAW devices, other charge sensitive 2DEG/2DHG areas can be added that operate in either the resonant centre frequency or in other resonant modes. These additional patterned 2DEG/2DHG areas will further enhance the resonant changes in the main SAW sensor through their charge gating. By studying the different signal shapes for different resonant modes, a selective sensing can be introduced.

Besides the charge-sensitive 2DEG/2DHG IDTs, other functional elements based on the 2DEG/2DHG conducting channel, such as a 2DEG/2DHG-Schottky diode and a 2DEG/2DHG-planar non-symmetrical diode, nanowires and high electron mobility transistors can be placed between and connected with input and output IDTs operating in a resonant filter mode, as shown in FIG. 8. The electrical characteristics of such functional elements are modulated due to acoustoelectric transduction, which is time correlated (synchronized with IDTs). This results in a minimal electric loss and a specified signal shape for the SAW resonance. Through the electrostatic field gating, for example by redox processes occurring on the surface, this resonant SAW filter mode is easily affected (frequency, amplitude).

Thus, due to its piezoelectric nature, the AlGaN/GaN heterojunction structure can be used as SAW sensors on the free standing AlGaN/GAN membrane. It is known, that the SAW sensors are very sensitive to surface charges in the SAW propagation path between emitter and receiver finger-electrodes or IDTs. In addition, the SAW sensors have a very high Q-factor at the resonant frequency. Moreover, the SAW sensors can be easily powered by an RF field with the corresponding frequency having an appropriate meander-based antenna. The SAW sensor offers the intrinsic RFID integration by using the orthogonal frequency coding. On the other hand, the 2DEG/2DHG-based sensors increase the evanescent near-field acoustoelectric effect through the 2DEG/2DHG-density charge-responsivity following by drastic increase of sensitivity to proximal electrical charges.

Figure 9:
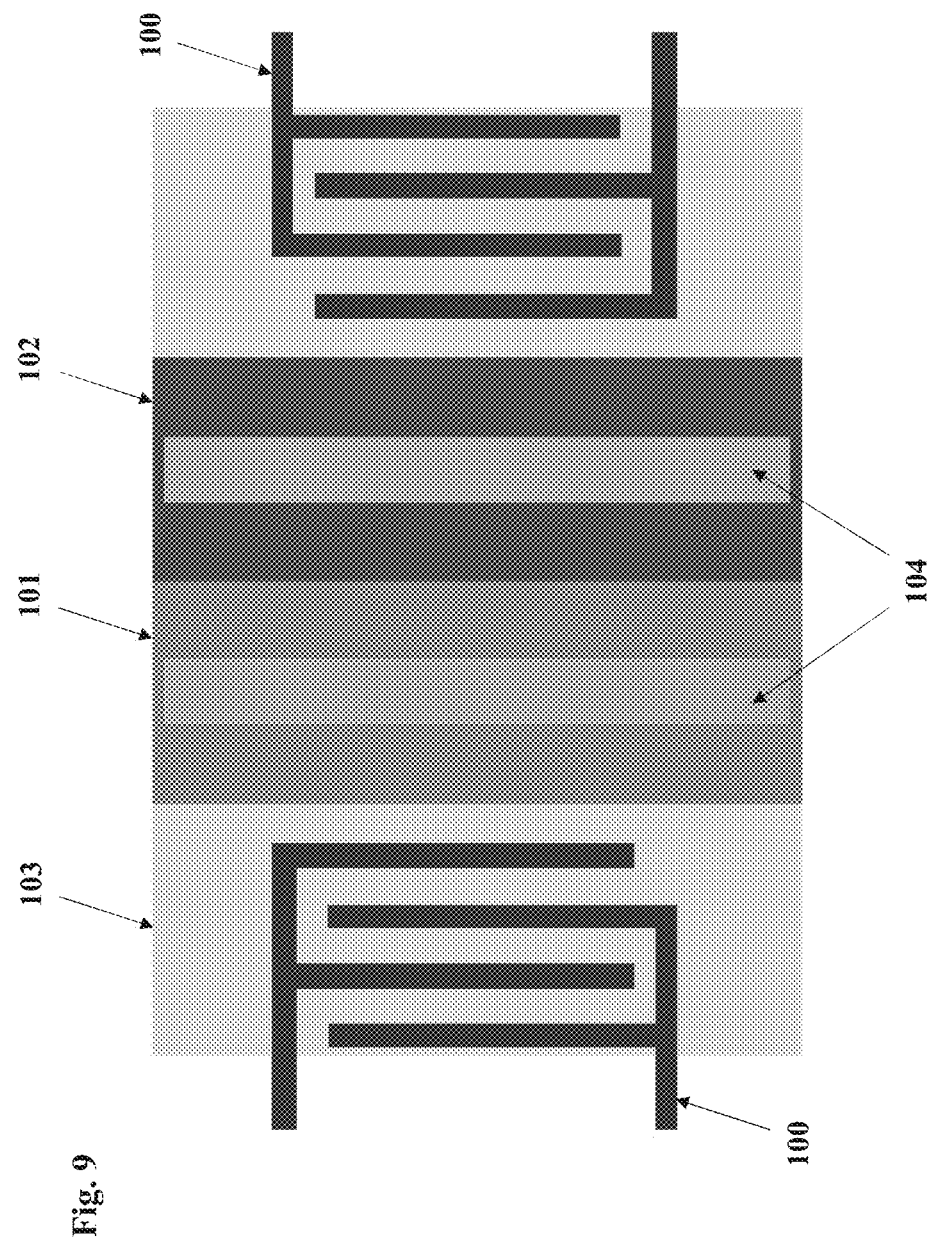
FIG. 9 schematically shows the basic topology of the sensor of an embodiment, wherein blue lines are assigned to metal structures, such as metal IDTs, light green lines represent the 2DEG/2DHG structures, dark green lines show the PC-HEMT-like structures, orange-coloured bands schematically show the (bio)molecular specific layers for sensing, and yellow area stands for the AlGaN/GaN-substrate.

The functional basic topology of the sensor of an embodiment is schematically shown in FIG. 9. The aim of the 2DEG/2DHG-SAW sensor topology is to achieve a largest influence of the SAW-transducer S21-transfer parameter without sacrificing the sensor stability. Lines (100) in FIG. 9 are assigned to IDT metal structures (100), band (101) shows a normally-on or normally-off HEMT-like structure (101), band (102) shows a PC-HEMT-like structure (102), which is actually a 2DEG/2DHG structure recessed to the thickness of 5-9 nm in order to achieve the pseudo-conducting effect, area (103) stands for the GaN/AlGaN piezoelectric substrate, and bands (104) schematically show the (bio)molecular specific layers for sensing.

Thus, in one aspect, the SAW RFID sensor chip of the present application comprises:
- a piezoelectric substrate (103), said substrate comprising a piezoelectric layer and a multilayer heterojunction structure, said structure being made of III-V single-crystalline or polycrystalline semiconductor layers, deposited on said piezoelectric layer and comprising at least one buffer layer and at least one barrier layer, said layers being stacked alternately;
- at least one pair of metal interdigitated transducers (IDT) (100) mounted on said piezoelectric substrate (103), for receiving a radio frequency (RF) input signal, transducing said input signal into a surface acoustic wave (SAW), propagating said surface acoustic wave along a surface of said piezoelectric substrate (103) and transducing said propagated surface acoustic wave into an output RF signal;
- at least one normally-on or normally-off HEMT-like structure (101) deposited on said piezoelectric substrate (103) for forming a normally-on or normally-off 2DEG or 2DHG conducting channel in said heterojunction structure at the interface between said buffer layer and said barrier layer;
- at least one PC-HEMT-like structure (102) deposited on said piezoelectric substrate (103) for forming the pseudo-conducting 2DEG or 2DHG channel in said heterojunction structure at the interface between said buffer layer and said barrier layer;
- at least one (bio)molecular layer (104) immobilised on said piezoelectric substrate (103) within the propagating SAW path for sensing target (analyte) chemical compounds or (bio)molecules; and
- electrical metallizations (not shown in the figure) capacitively-coupled to said IDTs (100) and to said HEMT-like structure (101) and/or PC-HEMT-like structure (102) for inducing displacement currents, thereby creating non-ohmic source and drain contacts, for connecting said sensor chip to an electric circuit.

The (bio)molecular specific layers (104) allow for example, gas molecules to be bound or adsorbed and then detected. This (bio)molecular layer may further increase sensitivity and selectivity of the PC-HEMT-based sensor. The (bio)molecular layer may be made of polymers, redox-active molecules such as phthalocyanines, metalorganic frameworks such as metal porphyrins, for example hemin, biomolecules, for example receptors, antibodies, DNA, aptamers or proteins, water molecules, for example forming a water vapour layer, such as a boundary surface water layer, oxides, semi conductive layer or catalytic metallic layer. The (bio)molecular layer (104) may be immobilised over either a portion of the 2DEG/2DHG structure surface or substantially over the entire surface of the 2DEG/2DHG area or PC-HEMT-like area to further improve sensitivity of the sensor for detection of target molecule or analyte.

In general, the (bio)chemical specific layer (104) may be any coating that adsorbs selected chemicals present in the environment. As the SAW propagates across the piezoelectric substrate from one IDT electrode to the other, the presence of molecules adsorbed on the coating changes the velocity and attenuation of the SAW. Measurements of these changes can be used to indicate the identity and concentration of a specific chemical compounds in the environment. By using coatings with selective adsorption properties, sensors that can detect specific (bio)chemical species for both gas-phase and liquid-phase environments can be developed. Typically, durable oxide-based coatings that are chemically modified to provide the required adsorption characteristics are used. These coatings can selectively adsorb ionic species from solution for use in applications such as monitoring electroplating processes or waste streams for toxic metals such as chromium, cadmium, or lead.

Polymer coatings that adsorb a wide variety of chemicals are ideally suited for monitoring the highly regulated ozone-depleting chlorinated hydrocarbons. Simultaneous measurement of the wave velocity and attenuation can be used to identify chemical compounds and their concentration. One of the applications of the SAW sensors of an embodiment is the selective detection of organophosphates, which are a common class of chemical warfare agent. The detection of these chemicals is done by the active chemical layer (104) composed of thin films of self-assembled monolayers. The sensitivity of these films on the piezoelectric substrate of the sensor endows the sensor with immunity to interference from water vapour and common organic solvents while providing sensitivity in the part-per-billion concentration of organophosphates. As a result, arrays of such sensors with appropriate coatings can be used to detect the production of chemical weapons.

Another application of the sensors of an embodiment is a chemical detection and analysis of environmentally toxic compounds and toxins, such as food toxins, for example aflatoxin, neurotoxic compounds, for example lead, methanol, manganese glutamate, nitrix oxide, Botox, tetanus toxin or tetrodotoxin, shellfish poisoning toxins, for example saxitoxin or microcystin, Bisphenol A, oxybenzone and butylated hydroxyanisole. In general, chemical detection and analysis of toxic compounds can be aimed at determining the level or activity of these compounds in the emission sample (into which the toxic compound is incorporated en route to human exposure, for example in industrial effluents), in the transport medium (for example, air, waste water, soil, skin, blood or urine), and at the point of human exposure, for example in potable water. Sensing the emission sample, the transport medium, and the point of human exposure may be necessary for a comprehensive plan designed both to detect toxic compounds, analyse them and to exert control on the emission of the toxic compounds in order to achieve hazard reduction. For a given toxic analyte, chemical sensors of an embodiment will differ in sensitivity, selectivity, or other characteristics, which may be required to monitor the emission sample, the transport medium, and individual exposure. The toxic compound concentration is typically greater in the emission sample than after dispersal in a transport medium and can vary widely. The physical and chemical properties of the analyte and its immediate environment (airborne vapour, contained in solid or liquid aerosol, chemically or photochemically reactive and decomposing into compounds of different toxicity, radioactive, ionic, acidic or lipophilic) are also influential in the design of a suitable configuration for the sensor of an embodiment.

Still another application of the sensors of an embodiment is a chemical detection of explosives. In general, a large range of explosives can be detected with the sensor of an embodiment. A distinction is made between the bulk explosives and the trace explosives. In case of the trace explosives, the sensor is capable of detecting vapours of the explosive chemicals, thereby detecting the trace quantities emitted from explosive materials either directly in the environment or in the particulates of explosive materials that have been collected and then vaporised in the laboratory within the analytical instrument. The sensor of an embodiment can be operated both by direct sampling of the air containing the trace explosive vapours as well as by vaporising a sample that was collected by swiping a surface contaminated with explosive particulates.

Apart from simply being able to detect explosive materials, the sensor of an embodiment is capable of identifying and quantifying the explosives. In general, a sensor that is used as a safety measure at airports will have other requirements than one that will be used in the field during military missions. Therefore, the configuration of the sensor can vary dependent on the particular application. There are different requirements to the throughput and, because of elevated background levels in military environments, the dynamic range. Furthermore, the military sensor for detection and analysis of explosives should be portable compared to the fixed sensors in laboratories or airports. Another consideration is the difference between detection and identification. In some instances a device will be used to sense whether a certain explosive material is present, whereas in others it is also necessary to determine which explosive compound it is. Furthermore, it can be important to consider how many different compounds, or groups of compounds, one device must be able to detect or identify. Different sensor configurations described below meet the above requirements for different types of the sensors.

Instead of detecting the explosive compounds themselves, the sensor of an embodiment may also be used to detect other materials that could indicate the presence of an explosive material. These "other" materials are actually associated compounds that tend to be present when explosives are present, such as decomposition gases or even taggants, materials that have been added during the production of the explosive to facilitate the detection. An advantage of this approach is that taggants and some associated compounds have a higher vapour pressure than the explosive compound itself, and are thus easier to detect. In addition to the sensitivity, the selectivity of the sensor should also be considered. The selectivity of the sensors of an embodiment to vapours of the trace explosives may be increased by using them in an array. By using the sensors in an array it is possible to obtain a signal similar to an artificial olfactory system of a nose when the responses of a number of sensors are combined to give a fingerprint-like signal. In this case, pattern recognition methods, such as multiple axes radar plots, can be used to analyse the signal, match it to known responses from a database, and thus identify the explosive.

Examples of the explosive materials detected by the sensor of an embodiment in aqueous medium are picrates, nitrates, trinitro derivatives, such as 2,4,6-trinitrotoluene (TNT), 1,3,5-trinitro-1,3,5-triazinane (RDX), N-methyl-N-(2,4,6-trinitrophenyl)nitramide (nitramine or tetryl), pentaerythritol tetranitrate (PETN), trinitroglycerine, nitric esters, derivates of chloric and perchloric acids, azides, and various other compounds that can produce an explosion, such as fulminates, acetylides, and nitrogen rich compounds such as tetrazene, octahydro-1,3,5,7-tetranitro-1,3,5,7-tetrazocine (HMX), peroxides (such as triacetone trioxide), C4 plastic explosives and ozonides. In addition to the explosives, 2,4-dinitrotoluene, nitrobenzene and several other organic compounds were tested being concomitant chemicals of TNT or some common water pollutants. The biomolecular layer (104) can be for example, a layer of the antibodies immobilised against a specific explosive compound. Alternatively, the molecular layer (104) can be phthalocyanine system having 2,2,3,3-tetrafluoropropyloxy substituents or cyclodextrin as sensitive materials for the detection of different explosives in aqueous media, in particular nitro-containing organic compounds.

As mentioned above, a biomolecular layer (104) sensitive to a certain target biomolecule, such as a specific pathogen, may be deposited on the piezoelectric substrate within the SAW propagation path. As a result, upon binding of the specific pathogen, a mass change and/or electric field change is normally observed and the density of the target (bio) molecules can be detected and further correlated to its concentration. In other words, the sensor of an embodiment acts like a miniature analytical balance, weighing the biological pathogens that bind to its surface. For example, biological pathogens may be captured very selectively by the biomolecular layer (104) consisting of specific biological receptor molecules, such as antibodies, short peptide chains or single-strand DNAs, which are capable of distinguishing between closely related pathogens. In fact, one can think of the sensor of an embodiment as a spring with a small weight bouncing at one end. As the (bio)molecule becomes attached to the sensor, the weight on the spring increases, which causes the speed of the spring's oscillation to significantly decrease. By measuring the oscillation speed or, equivalently, the oscillation phase shift, one can determine how much of the (bio)molecule has been captured.

Yet further application of the sensors of an embodiment is a biomolecular diagnostics including detection of DNA and proteins. In that case, the biomolecular specific layer (104) allows proteins and DNA molecules to be bound or adsorbed and then detected. This biomolecular layer further increases the sensitivity and selectivity of the sensor of an embodiment. The biomolecular layer can be made of various capturing molecules, such as primary, secondary antibodies or fragments thereof against certain proteins to be detected, or their corresponding antigens, enzymes or their substrates, specific DNA sequences complimentary to the DNA to be detected, aptamers, receptor proteins or molecularly imprinted polymers. The biomolecular layer (104) can be immobilised either over the surface of a portion of the recessed 2DEG/2DHG structure or over the entire surface of the PC-HEMT-like area to further improve sensitivity of the sensor for detection of a specific proteins or DNA molecules.

The blue IDT structures (100) receive the RF signal of about 0.5-2.5 GHz and exhibit the piezoelectric effect creating acoustic waves over the surface of the resonator. These surface acoustic waves propagate along the substrate with constructive interference from both input and output IDTs. The 2DEG/2DHG structures (101) and PC-HEMT-like structures (102) are placed and patterned (connected) in such a manner as to electrically shortcut the positive and negative electric charges from running the SAW and to thereby considerably change or minimize the amplitude of the signal received on both IDTs via the direct piezoelectric effect.

Both the 2DEG/2DHG structures (101) and PC-HEMT-like structures (102) are placed in the SAW bidirectional propagation path. The SAW is generated by zero-power meander antenna (not shown here) connected to both IDTs (100). If there are target (analyte) molecules present in the sample taken for analysis, they will be adsorbed on or attached to the (bio)molecular layers (104), thereby creating certain mass loading effect, which would alter the SAW amplitude and phase. Thus, the SAW propagating through this 2DEG/2DHG area is attenuating, changing its amplitude and phase as a result of the molecular interactions in the (bio)molecular layer. This effect is strongly dependent on the acoustoelectric interactions between the electric charge of the (bio)molecular layer and the 2DEG/2DHG channel depletion. Therefore, on the surface or in the areas of the PC-HEMT-like structures (102), the charge loading effect will lead to a significant 2DEG/2DHG channel density change having unique mass-charge loading combination. However, on the surface or in the areas of the regular 2DEG/2DHG (non-recessed) structures (101), the mass-charge loading effect will be different, which makes it possible to selectively identify (bio)molecular targets or chemical analytes.

Thus, what makes the sensor of an embodiment a particularly useful and unique sensing device is the combined use of the SAW and PC-HEMT-like structures placed on the same piezoelectric substrate.

Figure 10:
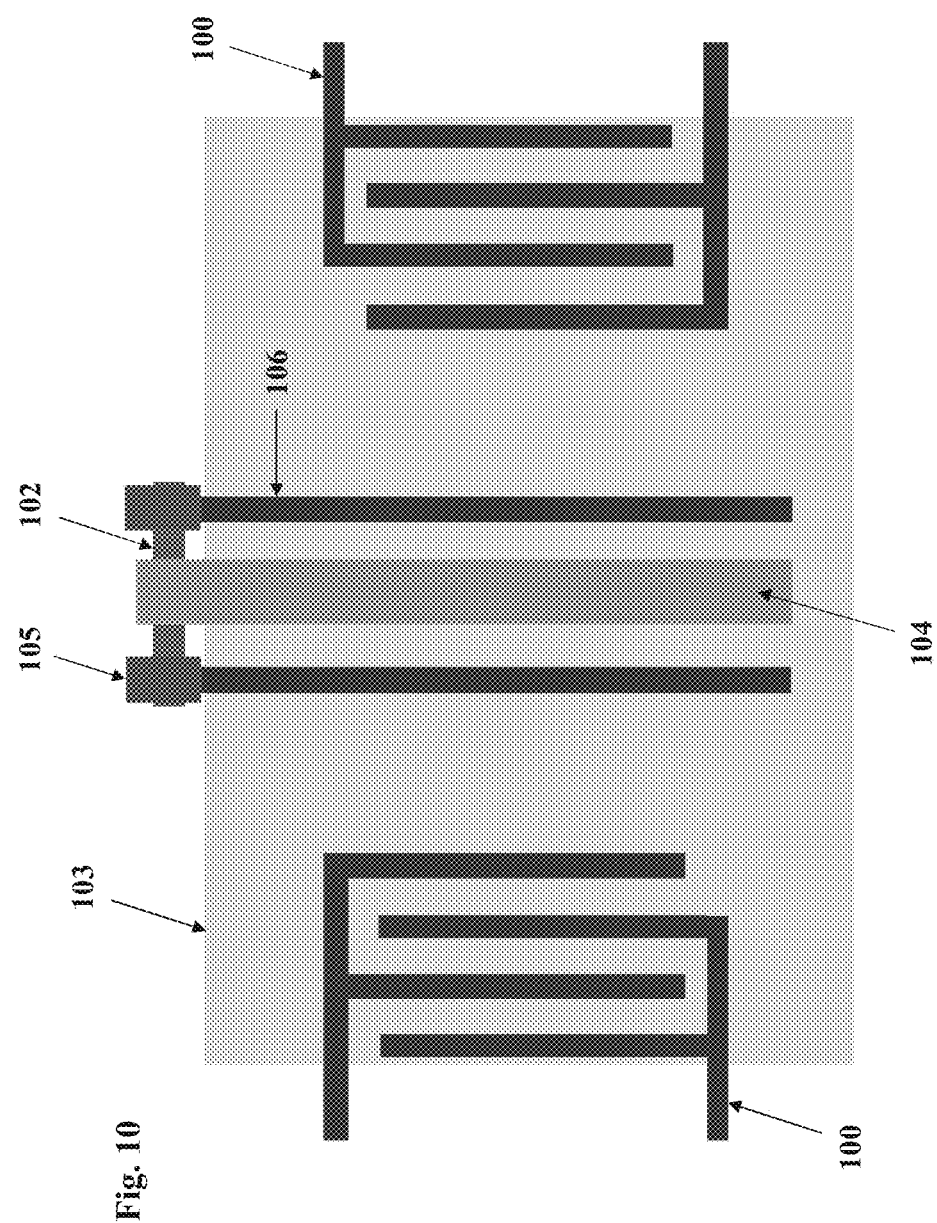
FIG. 10 schematically shows another basic topographic 2DEG-SAW sensor configuration of an embodiment. Metal stripes (shown in blue) are placed within the SAW propagation path at both sides (positive and negative SAW charge positions).

FIG. 10 shows another topographic 2DEG/2DHG-SAW sensor configuration. Metal stripes (106) (shown in blue) are placed within the SAW propagation path at both sides (positive and negative SAW charge positions), thereby short cutting and attenuating the SAW through the pseudo-conducting 2DEG/2DHG-channel of the PC-HEMT-like structure (102) having contacts (105) shown as the red bands to metal strips (106). The (bio)molecular layer (104) gates the PC-HEMT-like structure (102). Upon adsorption of the target molecules from the surrounding medium, the charge effect from this specific layer (gate) may cause the 2DEG/2DHG channel depletion, thereby decreasing the propagating SAW attenuation effect, which is based on electrical short-cutting.

The (bio)molecular layer (104) may be placed not only in the open gate area of the PC-HEMT-like structure (102), but also on the piezoelectric substrate (103) within the SAW propagation path for mass-loading effect information. The combination of both effects (charge-loading in the pseudo-conducting 2DEG channel and mass-loading on the piezoelectric substrate) may drastically increase selectivity of the sensor.

Figure 11:
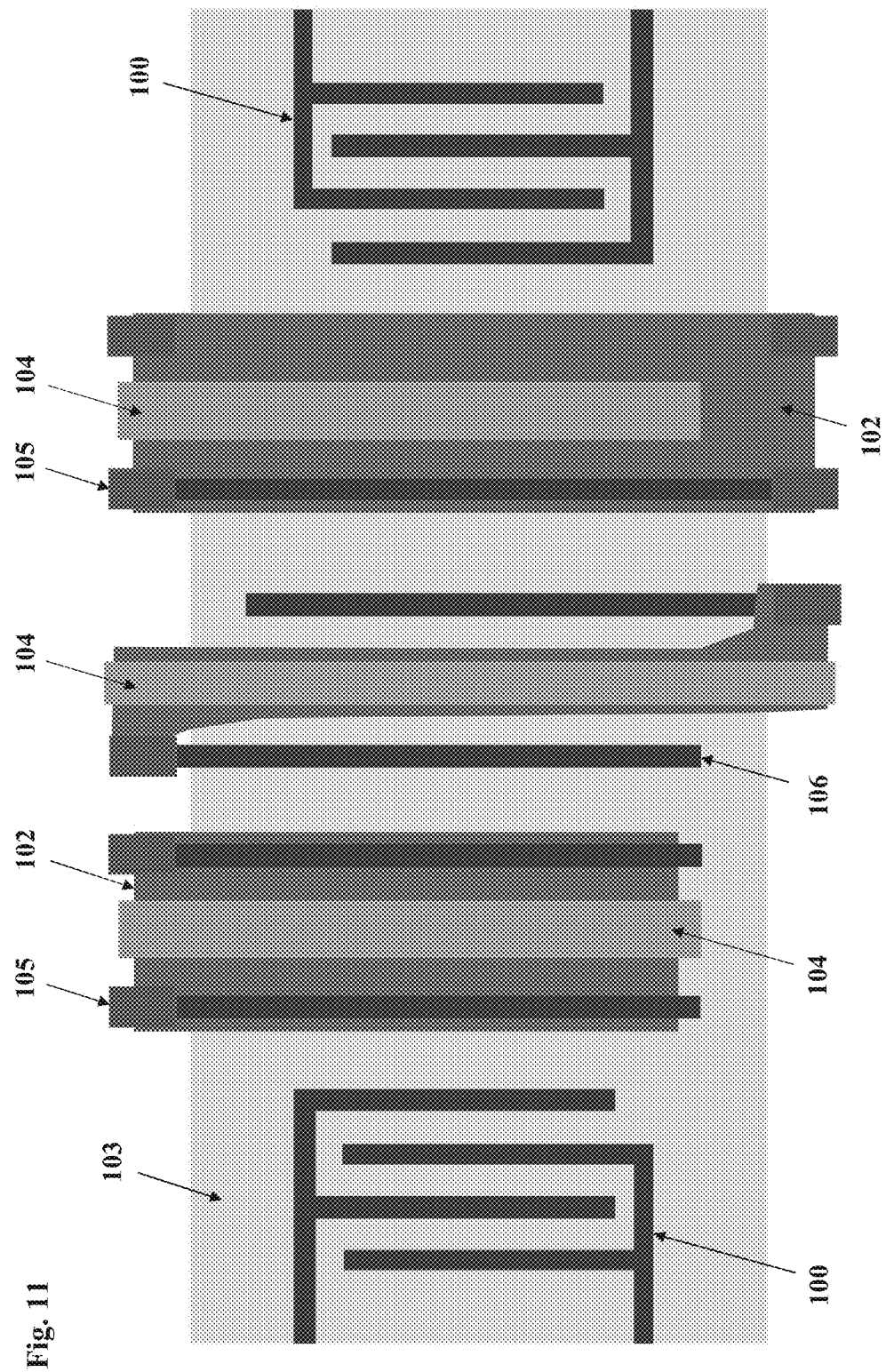
FIG. 11 schematically shows a further configuration for the sensor of an embodiment with the reflective SAW attenuating (and modulating) elements having a different interaction with the SAW and providing a special orthogonal frequency coded RFID pattern. In this configuration, several identical or different (bio)molecular layers are added.

FIG. 11 shows another configuration for the sensor chip of an embodiment that is similar to the configuration of FIG. 10, but differs in the reflective SAW attenuating (and modulating) elements having a different interaction with the SAW and providing a special orthogonal frequency coded RFID pattern. In this configuration, one or more same or different (bio)molecular layers may be added providing an excellent selectivity of the sensor.

Figure 12:
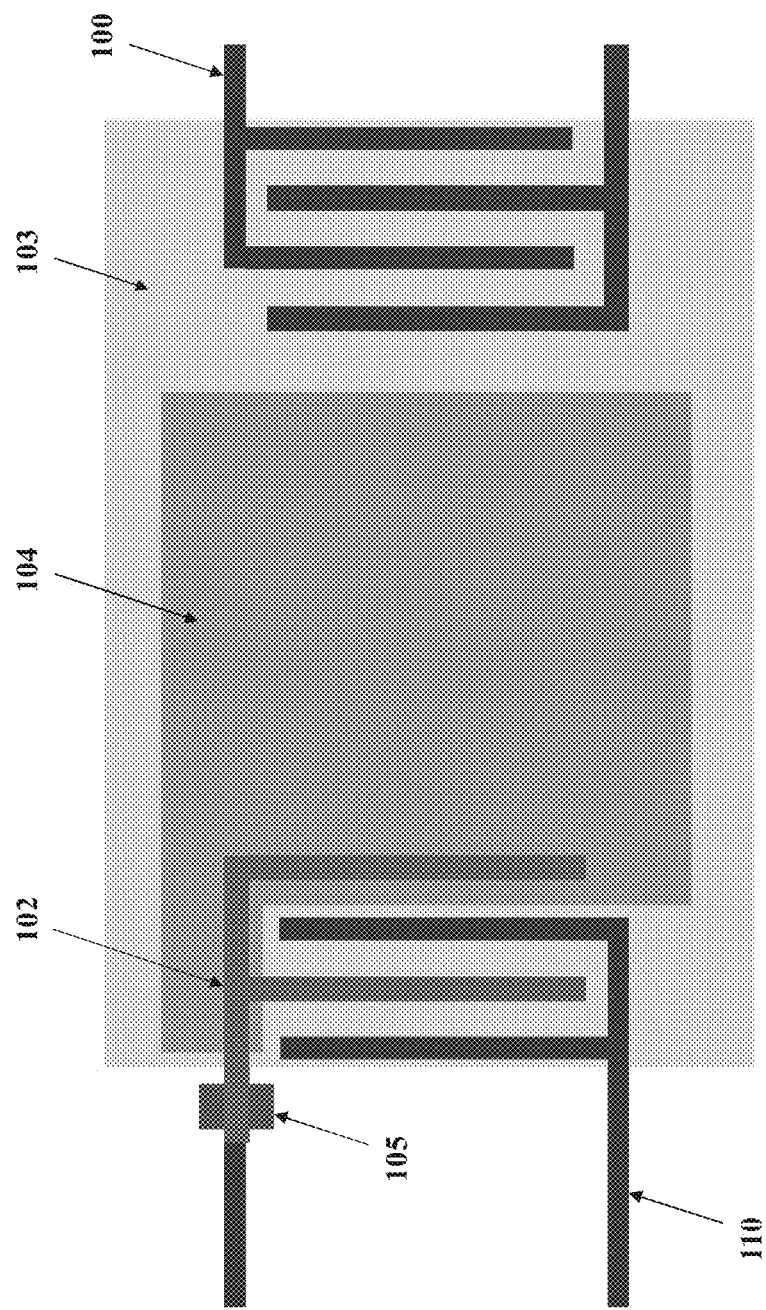
FIG. 12 schematically shows the sensor configuration of an embodiment having an emitter/receiver IDT on one side of the sensor (left on the figure), which is partially made from the PC-HEMT-like structure.

FIG. 12 schematically shows the sensor chip configuration of an embodiment having an IDT emitter/receiver (110) on one side (left on the figure) of the sensor partly made from the pseudo-conducting 2DEG/2DHG structure (102). This hybrid IDT (110) is actually a monopole connected to the contact (105) (shown in red). The (bio)molecular layer (104) exhibits strong charge modulation/loading on the PC-HEMT-like structure (102) and strongly changes a Q-factor from the SAW resonator. Thus, combined with a mass-loading effect, this configuration may provide high selectivity.

Figure 13:
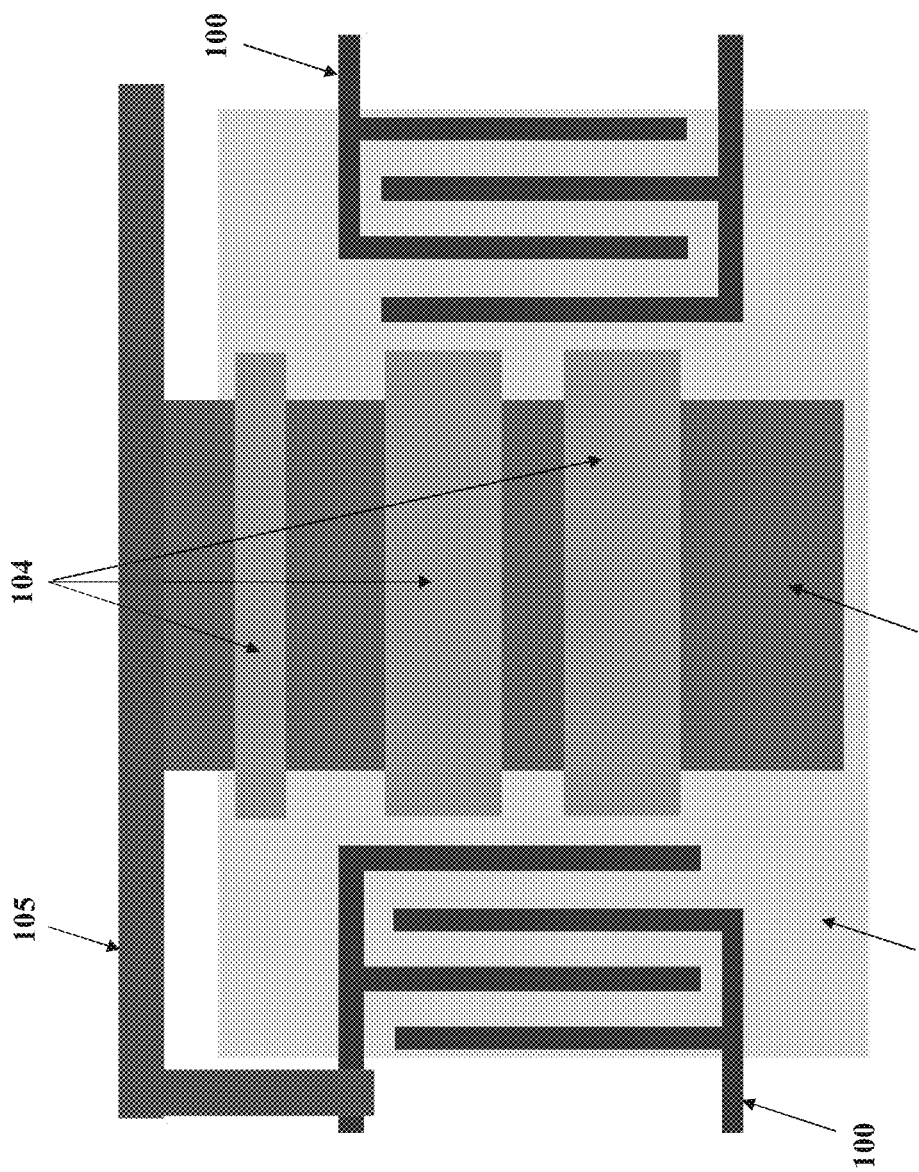
FIG. 13 schematically shows the sensor configuration of an embodiment having the signal part IDT electrodes (fingers) electrically connected to the large PC-HEMT-like structure via the ohmic contacts.

In a yet further configuration, schematically shown in FIG. 13, the signal part IDT electrodes (fingers) (101) are electrically connected to the large PC-HEMT-like structure (102) via the contacts (105). This may cause a very strong SAW attenuation. By means of charge loading interaction of (bio)molecular layers (104), which gate on the pseudo-conducting 2DEG/2DHG channel of the PC-HEMT-like structure (102), the sensor may become both very sensitive and very selective.

Figure 14:
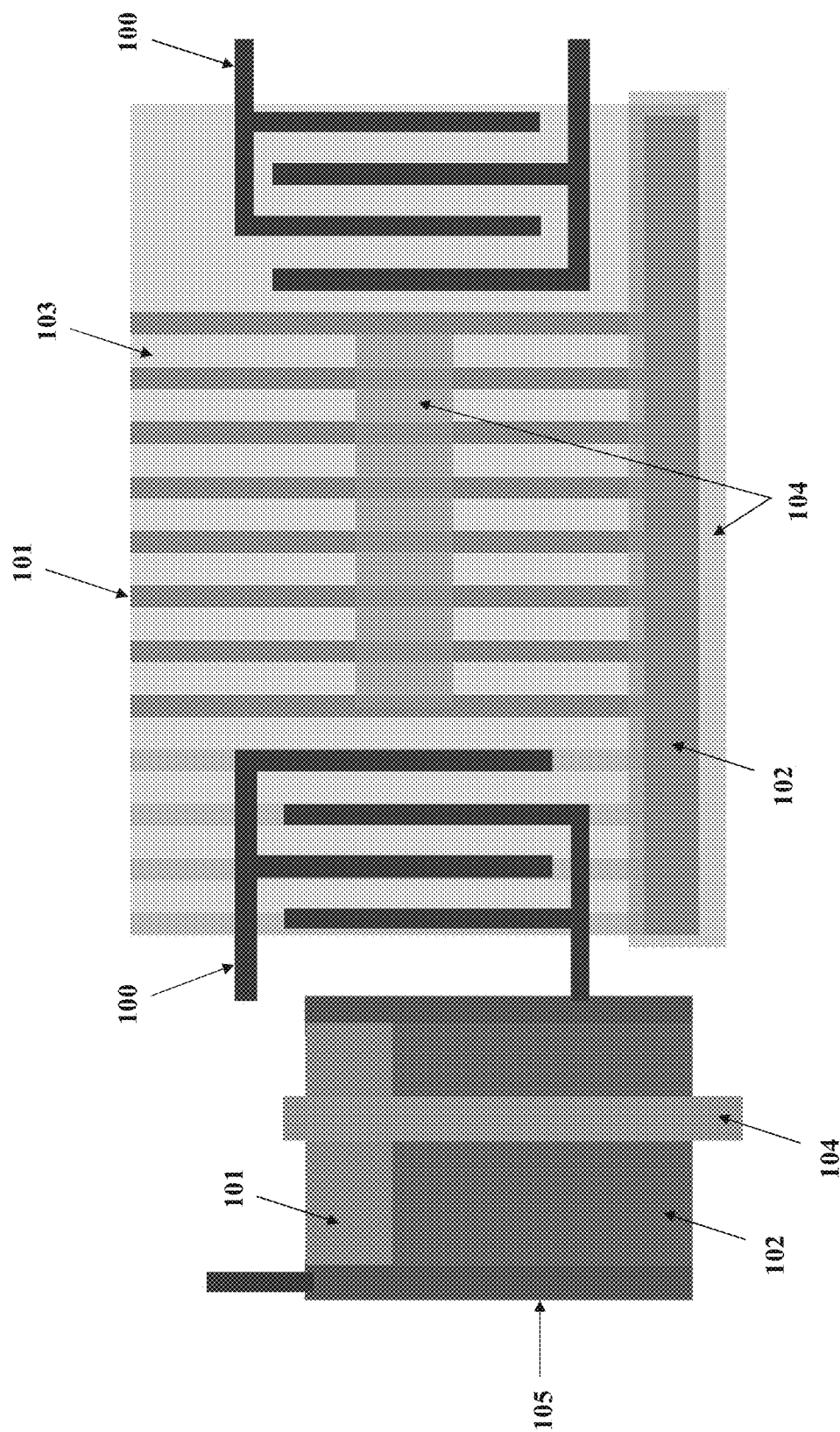
FIG. 14 schematically shows another basic topographic 2DEG-SAW sensor configuration of an embodiment. On the left, the PC-HEMT-like structure contains a pseudo-conductive 2DEG structure and non-recessed 2DEG structure in order to maintain a minimum SAW S21 stability.

The sensor chip configuration schematically shown in FIG. 14 is another basic topographic 2DEG/2DHG-SAW sensor configuration. On the left, the PC-HEMT-like structure with contacts (105) contains a pseudo-conductive 2DEG/2DHG structure (102) together with a non-recessed 2DEG/2DHG part (101) to maintain a minimum SAW S21 stability. Contacts (105) are represented by the red line. In this configuration, the maximal sensitivity is achieved with the maximal influence on the S21 transfer parameter by the (bio)molecular layer (104) placed in the gate area of the pseudo-conductive 2DEG/2DHG structure (102). The (bio)molecular layer (104) may also be placed within the SAW path for an additional mass loading effect in order to increase selectivity.

Figure 15:
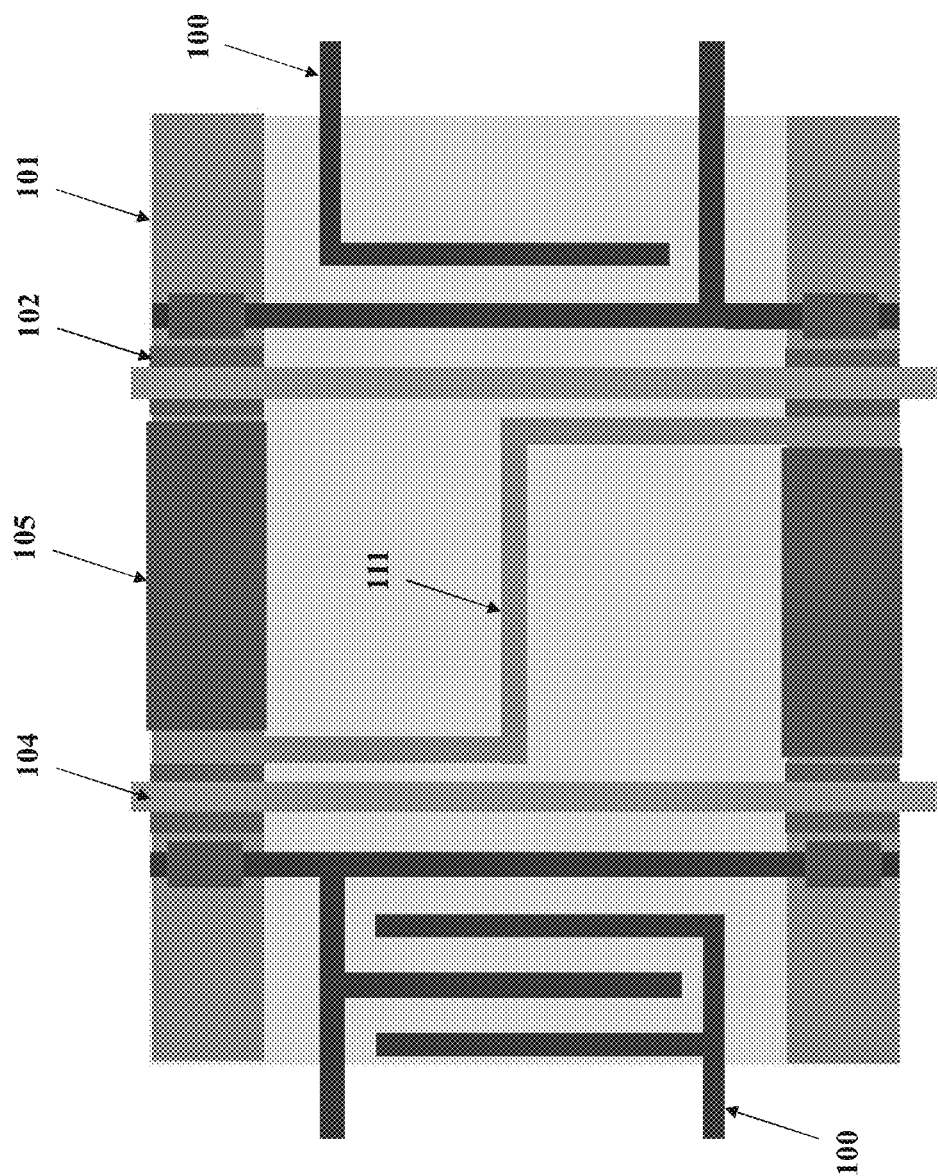
FIG. 15 schematically shows still another configuration of the 2DEG-SAW sensor of an embodiment. In this configuration, the meander antenna parts for the signal and ground charge are separated by counter shortcutting each other via the parasitic 2DEG line at the top and at the bottom of the shown layout.

FIG. 15 shows still another configuration of the 2DEG/2DHG-SAW sensor chip of an embodiment of the present application. In this configuration, the meander antenna parts for the signal and ground charge are separated by counter shortcutting each other via the parasitic 2DEG/2DHG line (111) at the top and at the bottom of the shown layout. This line is gated on the recessed (pseudo-conducting) 2DEG/2DHG areas (102) by the (bio)molecular layers (104). During this gating, the parasitic 2DEG/2DHG lines (101) are interrupted enabling the large increase of the S21 transfer parameter. The gating dynamics directly represents the final S21 amplitude dynamics and relates to the molecular diagnostics. The (bio)molecular layer (104) is also placed within the SAW path for an additional mass loading effect in order to increase selectivity.

Figure 16:
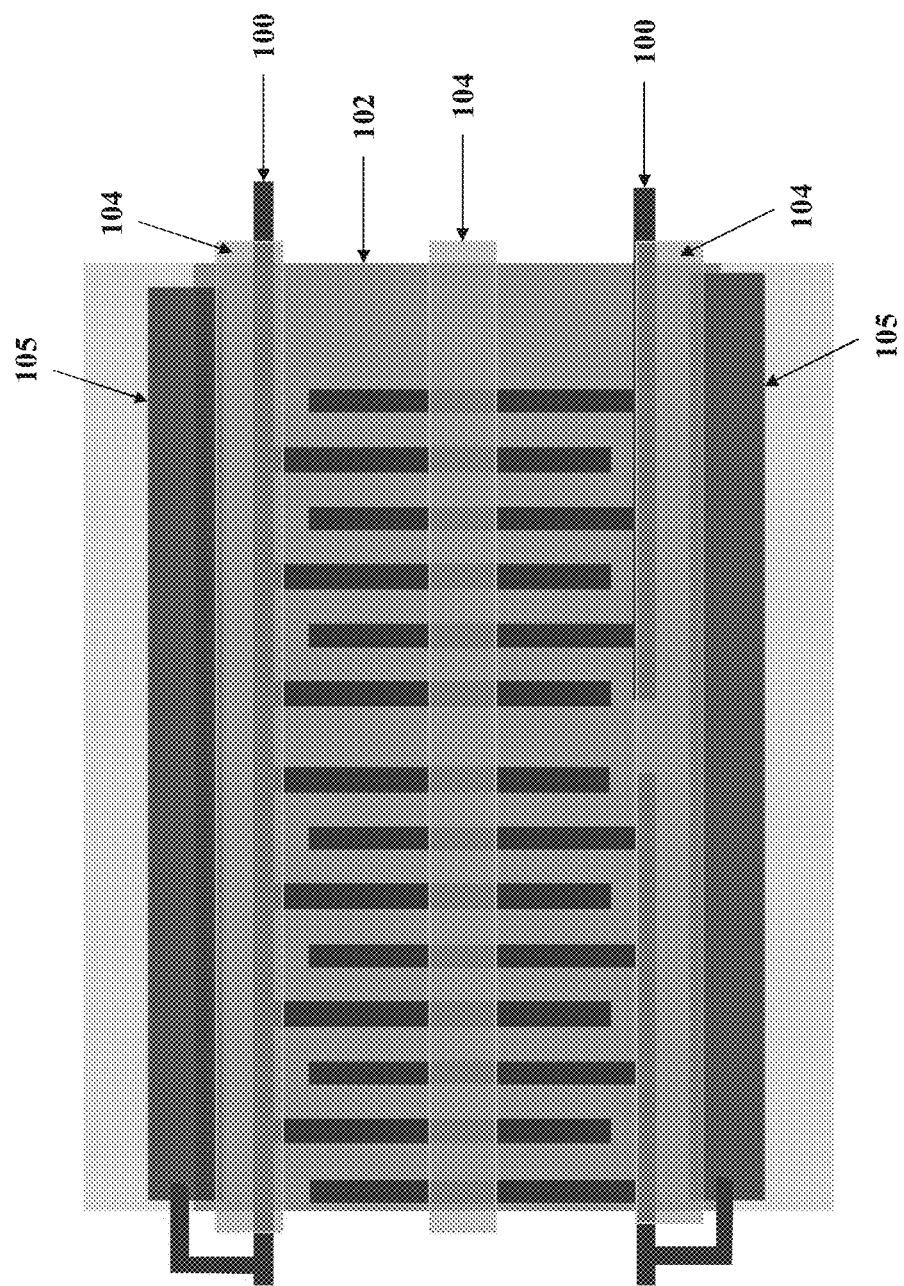
FIG. 16 schematically shows yet further configuration of the 2DEG-SAW sensor. In this simplest configuration, the pseudo-conducting 2DEG area is covering all the emitter-receiver IDTs area.

The last topological configuration of an embodiment is shown in FIG. 16. In this simplest configuration, the pseudo-conducting 2DEG/2DHG area (102) with contacts (105) may entirely cover all the emitter-receiver IDTs area. One or more (bio)molecular layers (104) may be placed within the SAW path for an additional mass loading effect in order to increase selectivity. Contacts (105) are shown by the red lines. The charge from a (bio)molecular layer (104) may then deplete the pseudo-conducting 2DEG/2DHG area (102), which is located beneath the Schottky metal surfaces, thereby minimising the parasitic shortcutting effect and tremendously increasing the influence on the S21 transfer parameter.

In all above configurations, the piezoelectric substrate (103) comprises a suitable material for forming the barrier layer and is composed, for example, of sapphire, silicon, silicon carbide, gallium nitride or aluminium nitride. The heterojunction structure made of AlGaN/GaN is deposited on this piezoelectric substrate layer, for example, by a method of metalorganic chemical vapour deposition (MOCVD). The non-recessed normally-conducting 2DEG/2DHG structures (101) are created in a close proximity to the interface between the GaN buffer layer and the AlGaN barrier layer. The specific thickness of the AlGaN barrier layer in the open gate area may be achieved by either dry etching the semiconductor material of the layer, i.e. recessing layer in the open gate area with the etching rate of 1 nm per 1-2 min in a controllable process, or by coating the buffer AlGaN layer with an additional ultrathin layer of the AlGaN material. To increase the charge sensitivity of the sensor, the surface of the recessed ultrathin AlGaN layer may be post-treated with plasma (chloride) epi-etch process. Consequently, the natively passivated surface is activated by the plasma etch to create an uncompensated (i.e. ionised) surface energy bonds or states, which are neutralized after the MOCVD growing.

The barrier layer then may be either recessed or grown as a thin layer to get the recessed pseudo-conducting 2DEG structure (102) that is actually a PC-HEMT-like structure. Thus, the 2DEG/2DHG conducting channel formed at the interface between the buffer GaN layer and the barrier AlGaN layer serves as a main sensitive element of the sensor reacting to a surface charge and potential. The 2DEG/2DHG conducting channel may be configured to interact with very small variations in surface or proximal charge or changes of electrical field as a result of the SAW creating a piezoelectrical effect, and thereby, interacting with the donor-like surface trap states of the AlGaN barrier layer.

Figure 17:
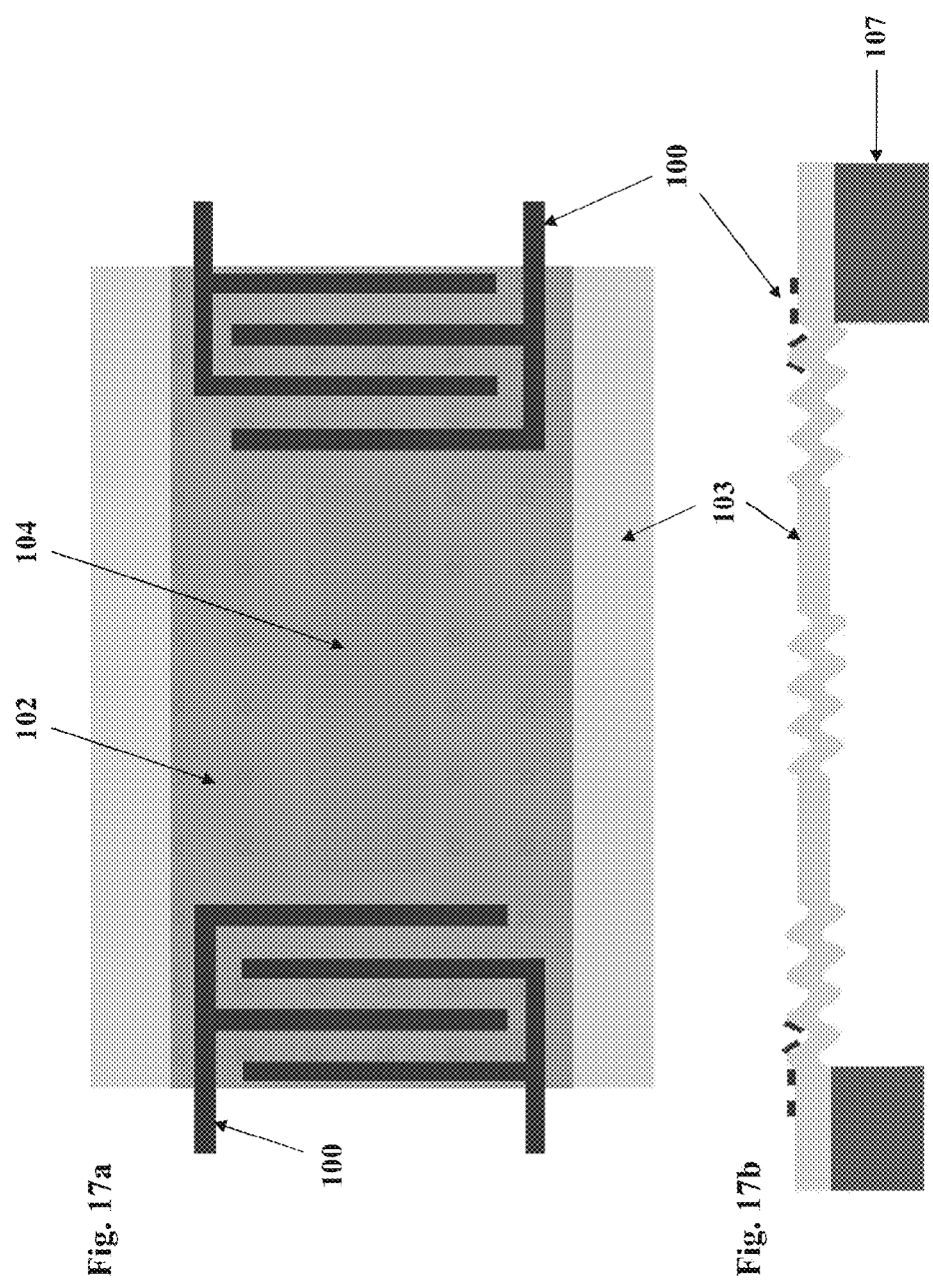
FIGS. 17a-17c schematically show a sensor configuration of an embodiment with free-standing membranes.

FIGS. 17a-17c schematically show a sensor configuration of an embodiment with free-standing membranes. In this configuration, the piezoelectric substrate (103) is growing on free-standing membranes (107). (Bio)molecular layer (104) is immobilised on top of the pseudo-conducting 2DEG/2DHG structure (102) within the SAW path between the IDT fingers (100) for a mass loading effect. Using this configuration makes is possible to increase selectivity of the sensor via adding mechanical stress (mass loading effect) of the (bio)molecular layer as an additional parameter of the sensor. The very flexible free-standing substrate columns-like membranes (107) can be made of the same material as the piezoelectric substrate layer (103) in all configurations of the sensor. In a particular embodiment, the free-standing substrate membranes (107) are composed, for example, of sapphire, silicon, silicon carbide, gallium nitride or aluminium nitride, preferably gallium nitride (GaN), having thickness of 0.5-2 μm. The free-standing substrate membranes are very sensitive to any tensile/compressive/mechanical stress changes in the (bio)chemical layer during chemisorption of gas or air molecules onto the surface of the multilayer hetero-junction structure. This results in a mass loading effect, which will be discussed below.

In general, mechanical sensors, much like pressure sensors, are based on the measurement of the externally induced strain in the heterostructures. The pyroelectric properties of group-III-nitrides, such as gallium nitride (GaN), allow two mechanisms for strain transduction: piezoelectric and piezoresistive. The direct piezoelectric effect is used for dynamical pressure sensing. For measurements of static pressure, such sensors are not suitable due to some leakage of electric charges under the constant conditions. For static operation, the piezoresistive transduction is more preferable.

Piezoresistive sensors using wide band gap materials have been previously employed using hexagonal silicon carbide bulk materials for high temperature operation. A piezoresistivity of GaN and AlGaN structures is comparable to silicon carbide. However, the piezoresistivity can be further amplified by any HEMT structure, as taught by Eickhoff et al (2001) in "*Piezoresistivity of Al$_x$Ga1-xN layers and Al$_x$Ga1-xN/GaN heterostructures*", Journal of Applied Physics, 2001, 90(7), 3383-3386. For piezoresistive strain sensing at relatively lower pressures (or pressure differences), diaphragm or membranes should be used, where the external pressure is transferred into a changed internal strain caused by bending, as shown in FIG. 17c. The resulting change in polarization alters the 2DEG/2DHG channel current which is measured.

Eickhoff et al (2001) conducted the first experiments on AlGaN/GaN hetero-structures where the 2DEG channel confined between the upper GaN and AlGaN barrier layer and demonstrated the linear dependence of the 2DEG channel resistivity on the applied strain. Moreover a direct comparison to cubic SiC and a single AlGaN layer clearly demonstrated the superior piezoresistive properties of the latter. From these results, it is clear that the interaction of piezoelectric and piezoresistive properties improves the sensitivity of pressure sensors by using GaN/AlGaN hetero-structures confined with the 2DEG channel.

The sensor configuration shown in FIGS. 17a-17b involves piezoelectrically coupled, charge and mass sensitive, free-standing GaN membranes, which are prepared, for example, according to U.S. Pat. No. 8,313,968, and offer an elegant and effective solution to achieve both downscaling and an integrated all-electrical low-power sensing-actuation. As mentioned above, GaN exhibits both, piezo- and pyro-electrical properties, which can be functionally combined. Whereas the piezoelectricity enables realisation of an integrated coupling mechanism, the 2DEG/2DHG additionally delivers a pronounced sensitivity to mechanical stress and charge, which allows the sensor to use the pyroelectric effects. The dynamic change in 2DEG/2DHG conductivity is also caused by a change in piezoelectric polarisation.

FIG. 18 shows the photolithographic layout masks of the 2DEG-based SAW resonator using the standard configuration with two symmetrical IDT structures (fingers). The IDT fingers may be made of Cr10/60Au metal alloys and have a preferable width of 200, 300, 400, 500 or 700 nm. They are fabricated in one e-beam step as a lift-off bi-layer resist system stack or a negative resist and ion milling. The 2DEG/2DHG may not be structured in that case and may interact with the surrounding medium. The darker (blue) area in the middle represents a free-standing area (601), where the (silicone) substrate is removed by the deep reactive-ion etching (DRIE) process.

Figure 19:
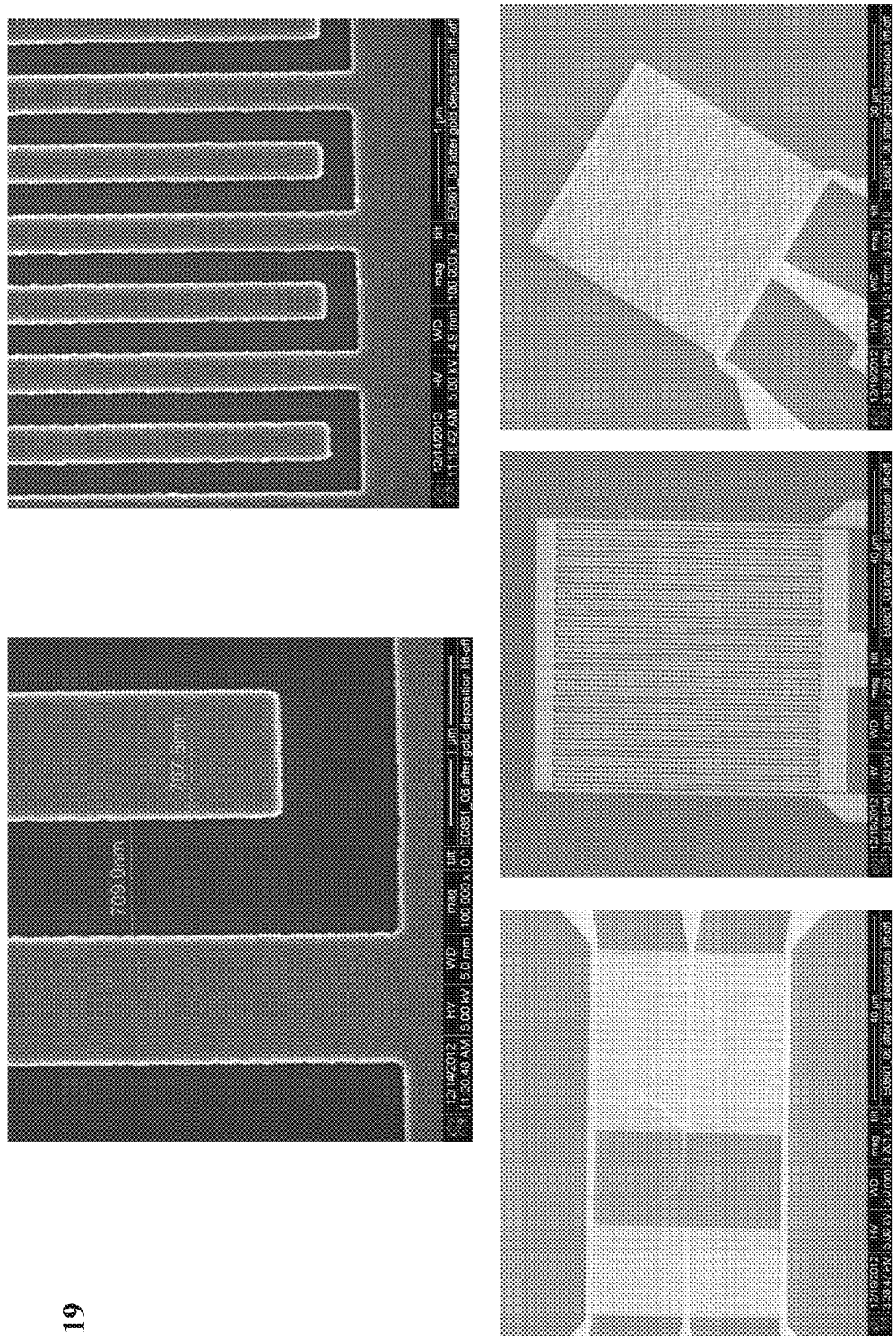
FIG. 19 shows the SEM images from several different IDT layouts of the SAW resonators fabricated via the lift-off/or ion-milling patterning technique.

FIG. 19 shows the SEM images of the SAW resonator of an embodiment as shown in FIG. 18. This SAW resonator is fabricated via the lift-off/or ion-milling patterning technique. FIG. 20 shows the microscope images of these SAW resonators on the free-standing GaN/AlGaN membranes having the unstructured 2DEG/2DHG area with the silicon substrate removed via the DRIE process. The SAW IDTs shown here have different IDT periods ranging from 200 nm to 700 nm and therefore, reflect light differently. In general, leaky waves are frequently used in these kinds of substrates for their relatively large electromechanical coupling coefficient, which enables them to form a relatively wide passband required for transmitting and receiving mobile device signals. For example, in the present SAW resonator having a working frequency of 2 GHz, the wavelength λ is calculated from $λ×2×10^9=4000$ m/s, resulting in λ=2 μm. This calculated wavelength should be equal to the length twice as the electrode pitch for excitation, and assuming that the spaces between the electrodes are the same as the electrode width, the width of the electrode is estimated to be 0.5 μm. The actual spaces between the electrodes are about 0.7 μm as seen in FIG. 19.

FIG. 21 shows the experimental S21-transfer parameter measured with the sensor of an embodiment using the vector network analyser at SAW resonant frequency of 1280 MHz for the IDT finger having a distance of 700 nm. During the measurements of the S21-transfer parameter, the sensor of an embodiment was exposed to additionally humidified air with increased RH of 20% (blue line). The S21-transfer parameter showed an instant change in amplitude, frequency and phase during 5-seconds long exposure to humidified air.

Figure 22:
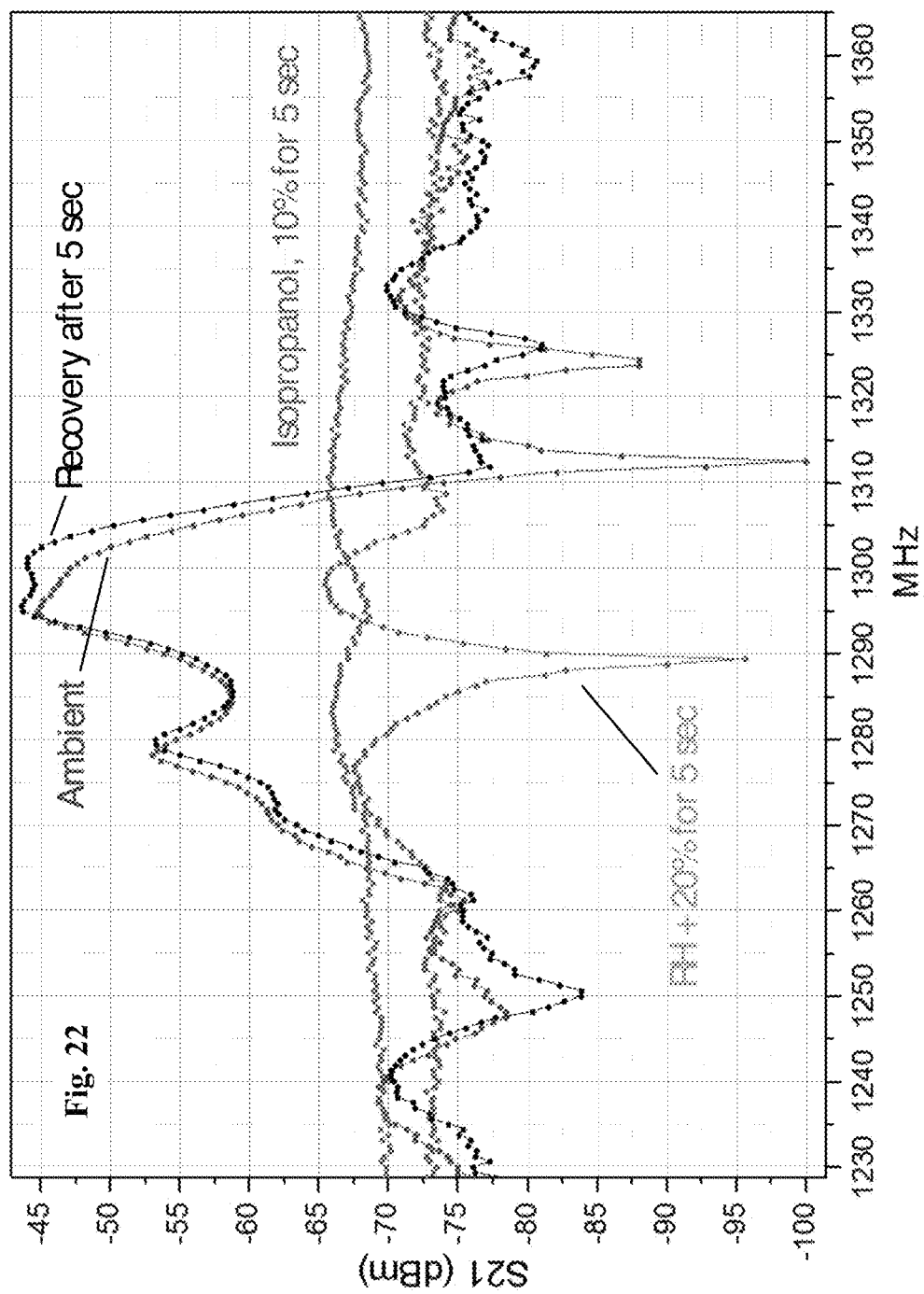
FIG. 22 shows the S21-transfer parameter (red) from FIG. 21 measured with the 2DEG-based SAW resonant sensor of an embodiment, having 700 nm IDT-finger width.

FIG. 22 shows the S21-transfer parameter (red) from FIG. 19 measured with the different 2DEG-based SAW resonant sensor of an embodiment, having 700 nm IDT-finger width. During the measurements of the S21-transfer parameter, the sensor was exposed to a humidified air (+20% RH) (pink line) and then to 10% (isopropanol vapour, dark yellow line) and vice versa for 5 seconds. The sensor clearly demonstrated an instant response with the visibly large changes in the S21-amplitude, frequency and phase. Following the 5-seconds exposure, the S21-parameter of the sensor showed an immediate recovery (black line).

Figure 23:
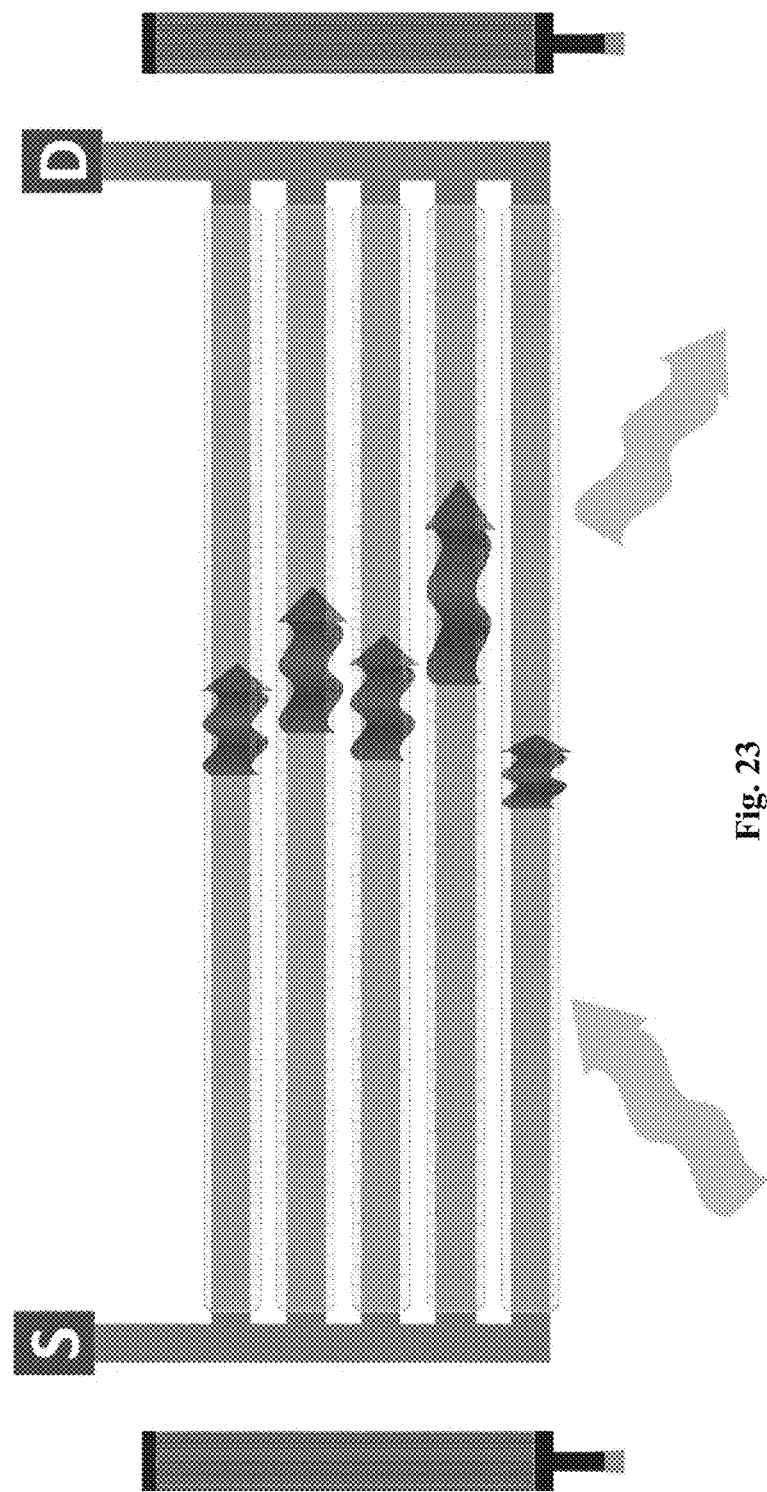
FIG. 23 schematically shows the principle of electron-speed differentiation in the different 2DEG channels under interaction with the SAW and time-resolved changes in the 2DEG electron density.

FIG. 23 schematically shows the principle of electron-speed differentiation in the different 2DEG/2DHG channels under interaction with the SAW and time-resolved changes in the 2DEG/2DHG electron density. The configuration shown in this figure actually illustrates the speed differences between the electron flow in the pseudo-conducting 2DEG/2DHG channel and the SAW propagation. The 2DEG/2DHG electrons within the 2DEG/2DHG channel have a lateral speed compared to the SAW propagation rate. In addition, there is an effect of electron trapping (catching) within the SAW effect. In fact, the SAW catches electrons within a running positive and negative piezoelectric charges created by the propagating SAW.

In the above configuration (FIG. 23), there are several 2DEG/2DHG channels placed between the IDTs and conducting an electric current. These pseudo-conducting channels have different (bio)molecular layers. Depending on the charge loading and partly on mass loading as well, the electron speed in the different 2DEG/2DHG channels will be different causing the time differences in the SAW-assisted charge transport. Thus, depending on the 2DEG/2DHG-channel depletion level as a result of the (bio)molecular interactions of the target (or analyte) molecules with the (bio)molecular layer in the surrounding medium, each pseudo-conducting 2DEG/2DHG channel may have different electron speed, which will be recognised and detected by the SAW propagating through the (bio)molecular layer.

In addition, if excited with UV-VIS light, the charge transporting effect of the sensor may be drastically increased resulting in the increased selectivity. In fact, light enhances this effect by many times increasing the amount of surface trap states, as explained above.

Figure 24:
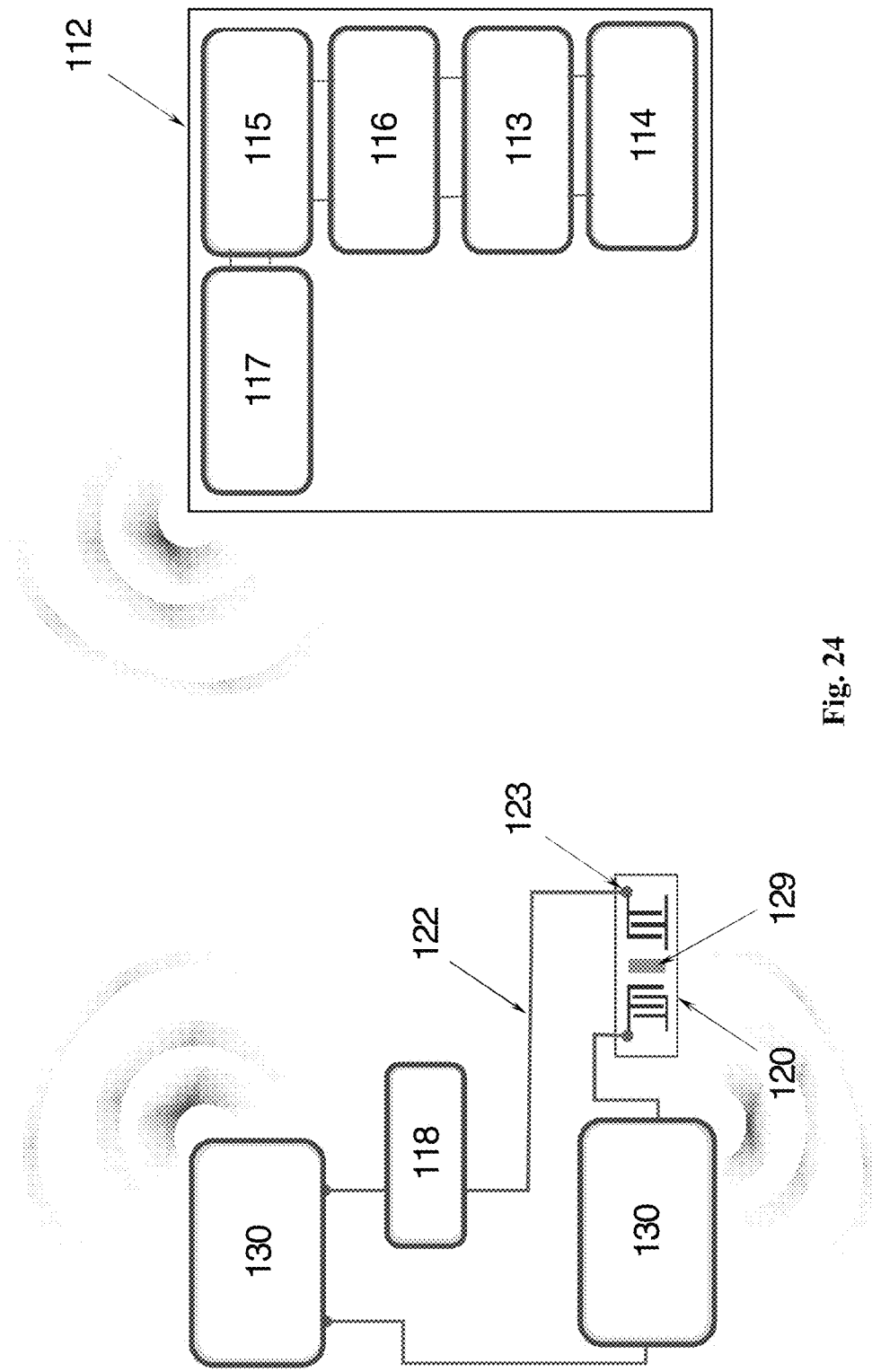
FIG. 24 schematically shows a zero-power SAW RFID sensor of an embodiment for molecular diagnostics with a remote readout.

FIG. 24 schematically shows a sensing device of an embodiment, for chemical detection and (bio)molecular diagnostics, with a remote readout, comprising the following components:
- the SAW sensor chip (120) of the application with a (bio)molecular layer (129) immobilised on its surface within the propagating SAW path, and connected via contacts (123) to an electric circuit (122);
- one or two out-input SAW-RFID zero-power fractal antennas (130), each connected to said contacts (123) via the electric circuit (122) for receiving or transmitting a signal;
- an output-input separation by delay line SAW transducer (118);
- an integrated circuit (112) for storing and processing said signal, and for modulating and demodulating a radiofrequency (RF) signals, said circuit comprising:
  a) a voltage source (114) supplying electric current to said SAW sensor chip (120) and to said one or two antennas (130);
  b) an integrated or CMOS current amplifier (115) for amplification of an electric current obtained from said SAW sensor chip (120);
  c) an analogue-to-digital converter (ADC) with wireless input/output modules (116) connected to said current amplifier (115) for wireless outputting the converted signal to a user interface or external memory;
  d) a microcontroller unit (MCU) (113) for processing and converting the received signal into data readable in said user interface or external memory; and
  e) a wireless connection module (117) for wireless connection of said sensor to said user interface or external memory.

The voltage source (114) can be any suitable and commercially available battery of the Li-ion type, any energy harvester with AC-DC or DC-DC converters or photovoltaic element. The ADC card (116) is any suitable analogue-to-digital converter data logger card that can be purchased, for example, from National Instruments® or LabJack®. The current amplifier (115) is connected in-line and can be any commercially available femtoampere amplifier, for example SRS® SR570, DLPVA-100-F-S, FEMTO® current amplifier DDPCA-300 or Texas Instruments® INA826EVM. Optionally, a current amplifier can be operated directly with current flowing via the 2DEG/2DHG channel of the 2DEG/2DHG structures into the amplifier with small input resistance of 1M$\Omega$ at gain higher than $10^4$ and only 1$\Omega$ at gains lower than 200. This setup may directly amplify the electric current modulation in the 2DEG channel originated from an external body charges. All readout components are battery powered to avoid ground loop parasitic current.

In a specific embodiment, the wireless connection module (117) can be a short-range Bluetooth® or NFC providing wireless communication between the wearable device or gadget and a smartphone for up to 20 m. If this module is Wi-Fi, the connection can be established with a network for up to 200 nm, while GSM allows the worldwide communication to a cloud. The external memory may be a mobile device (such as a smartphone), desktop computer, server, remote storage, internet storage or (bio)molecular diagnostics cloud.

As shown in the present application, the sensors of the present application are used for chemical detection and (bio)molecular diagnostics. In some embodiments, the sensors of the present application can be used for portable long-time-operation solution within remote cloud-based diagnostics. The portable sensor of an embodiment should have a very small power consumption saving the battery life for a prolong usage. In this case, the non-ohmic high-resistive contacts capacitively connecting the sensor to an electric circuit are preferable. The non-ohmic contacts actually limit an electric current flowing through the 2DEG/2DHG channel by having an electrical resistance 3-4 times higher than the resistance of the 2DEG/2DHG-channel, thereby reducing electrical power consumption without sacrificing sensitivity and functionality of the sensor. Thus, the use of non-ohmic contacts in some embodiments of the sensor of the present application is a hardware solution allowing to minimise the power consumption of the device. In another embodiment, the power consumption of the device can be minimised using a software algorithm managing the necessary recording time of the sensor and a battery saver mode, which limits the background data and switches the wireless connection only when it is needed.

Alternatively, the sensor of an embodiment, may be based on a piezoelectric electro-optical crystal transducer (EOC)

combined with the PC-HEMT-like structure (recessed 2DEG/2DHG-based structure) for (bio)molecular diagnostics. The sensor based on the EOC piezoelectric substrate exhibits the highest coupling between electrical and mechanical energy compared to all other varieties of substrates. Additionally, such a substrate also has the advantages of having a high velocity-shift coefficient and a very high electromechanical coupling coefficient, K2, which yields a greater mass sensitivity in comparison with the same regular SAW device on any other piezoelectric substrates. The EOC may be any suitable electro-optical crystalline material such as $LiNbO_3$, which is brought into a physical contact with a single point on a user's body. The EOC is then illuminated with a polarised light.

In case of the $LiNbO_3$ crystalline material, the wavelength of the polarised light is about 400-600 nm. Modulated light from the light source illuminates the EOC, and then falls on the 2DEG/2DHG-based structure. The 2DEG/2DHG-based structure is ultrasensitive to an incident light creating the p-n-pairs in the AlGaN barrier layer and consequently, strongly affecting the 2DEG/2DHG-conductivity. In general, irradiation of the 2DEG/2DHG-based structure with light switches the 2DEG/2DHG-channel from normally-off to a pseudo-conducting or normally-on state. Therefore, by contact with a body, the EOC is capable of changing its light absorbance strongly affecting the electrical current flow in the 2DEG/2DHG channel, thereby resolving any smallest light intensity changes coming from the EOC transducer. Depending on the excitation light wavelength, the position of the sensor relative to the incident light beam can be changed. For instance, in case of IR light (700-1500 nm), the sensor should be placed perpendicularly to the light beam for achieving the highest sensitivity. The parasitic charging of the EOC is compensated via the electrodes attached to the crystal. Additionally a variety of light filters in front of the sensor can be utilised.

Figure 25:
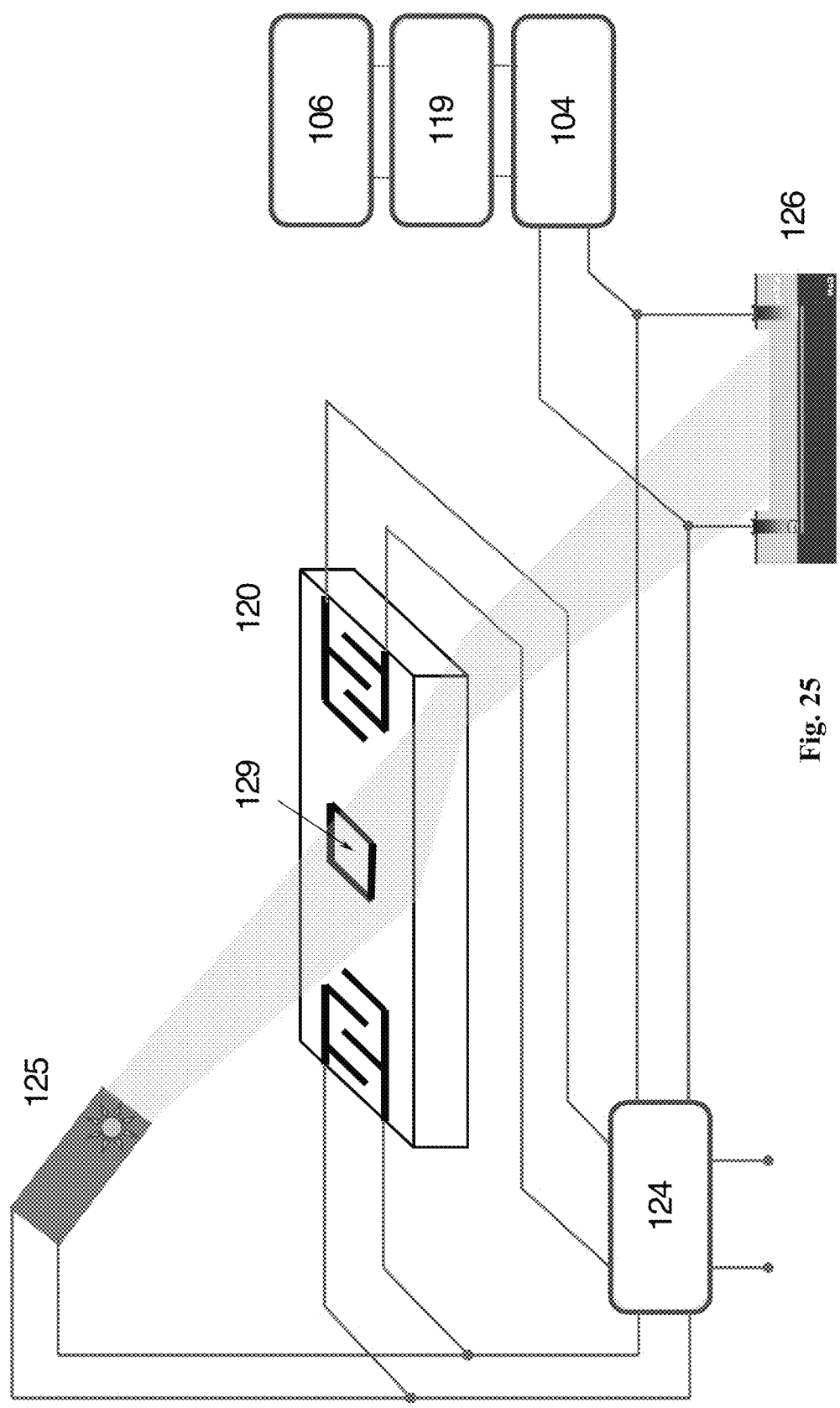
FIG. 25 schematically shows an optoelectronic sensor of an embodiment for molecular diagnostics with a remote readout.

In still another embodiment, FIG. 25 schematically shows an optoelectronic sensing device of an embodiment, for chemical detection and (bio)molecular diagnostics, with a remote readout comprising the following components:
- the SAW sensor chip (120) of the embodiments with a (bio)molecular layer (129) immobilised on its surface within the propagating SAW path, and connected to an electric circuit;
- a modulated light source (125), such as a surface-mounted-device light-emitting diode (SMD LED) or UV-VIS-IR laser diode, for irradiating the AlGaN barrier layer surface of the pseudo-conducting 2DEG/2DHG structure (126) on the sensor chip;
- optocoupler switches (124) for coupling said modulated light source (125) with said pseudo-conducting 2DEG/2DHG structure (126) on the sensor chip;
- a voltage source (104) connected to said electrical circuit for supplying electric current to said SAW sensor chip (120);
- a lock-in amplifier (119) connected to said voltage source (104) for amplification of a signal with a known carrier wave obtained from said SAW sensor chip and increasing the signal-to-noise ratio; and
- an analogue-to-digital converter (ADC) with in-built digital input/output card (106) connected to said lock-in amplifier (119) for outputting the converted signal to a user interface or external memory.

Thus, the use of the SAW-EOC configuration makes it possible to drastically increase the sensitivity of the sensor to an electrical charge, to discharge the EOC via the SAW-based charge transport along the crystal surface, to efficiently modulate polarised light from the light source and to control the SAW delay line effect with the phase velocity signal. The optocoupler switches (124) are capable of coupling the pseudo-conducting 2DEG/2DHG-based structure (126) with the SAW-EOC such that the initial SAW actuation signals at the emitter (left) IDT electrodes are synchronised with the modulated light source (125) and with the $V_{DS}$ at the pseudo-conducting 2DEG/2DHG-based structure. A signal at the receiver (right) IDT electrodes is coupled back to the $V_{DS}$ via the opto-coupler (124), which is brought into a resonance with initial signals and with the light source (125) modulation. Due to a physical galvanic connection of the SAW-EOC with the body single point by spatially patterned electrodes, the EOC changes its light absorption and modulation properties. This strongly affects the resonant mode of the five initial signal sources ($V_{DS}$, emitter IDT, light source, receiver IDT and SAW-modulated light source). Thus, because of the light source-based interaction, the resonant system becomes very stable and also very sensitive to external charges.

In some embodiments, a method for chemical detection and (bio)molecular diagnostics comprises the following steps:
1) Subjecting a sample to be tested to the sensing device of the embodiments;
2) Recording signals received from the sample in a form of a S21-transfer parameter dynamics of the device over time (defined as S21-transfer dynamics) with said device;
3) Transmitting the recorded signals from said device to an external memory for further processing; and
4) Converting the transmitted signals to digital signals and processing the digital signals in the external memory, correlating said S21-transfer dynamics with pre-calibrated chemical or (bio)molecular S21-transfer waveforms stored in the external memory, and extracting chemical or (bio)molecular information from said waveforms in a form of readable data, thereby detecting and/or identifying the particular chemical or biological compound (analyte) in the sample and/or measuring its concentration.

In summary, what makes the sensor of the present embodiments a particularly useful and unique sensing device is the combination of the SAW and PC-HEMT-like structures on the same piezoelectric substrate. The non-recessed 2DEG/2DHG structures (101) and the PC-HEMT-like structures (102) are both placed in the SAW bidirectional propagation path. The SAW is generated by zero-power meander antenna connected to the IDTs (100). (Bio) molecules absorbed on the (bio)molecular layers (104) create the mass loading effect, thereby altering the propagating SAW amplitude and phase. Thus, the SAW propagating through the 2DEG/2DHG area becomes attenuating, changing its amplitude and phase as a result of the molecular interactions of adsorbed (bio)chemical targets or analytes in the (bio)molecular layer. This effect is strongly dependent on the acoustoelectric interactions between the electric charge of the (bio)molecular layer and the depletion state of the 2DEG/2DHG channel. Therefore, on the surface or in the areas of the PC-HEMT-like structures (102), the charge loading effect will lead to a very strong change in the 2DEG/2DHG density having unique mass-charge loading combination. However, on the surface or in the areas of the normal (non-recessed or not recessed to the thickness of 5-9 nm) 2DEG/2DHG structures (101), the mass-charge loading effect will be different that makes it possible to selectively identify chemical and biological targets (compounds, analytes) and detect minute mass differences.

REFERENCES

S. D. Burnham, K. Boutros, P. Hashimoto, C. Butler, D. W. S. Wong, M. Hu, and M. Micovic, "*Gate-recessed normally-off GaN-on-Si HEMT using a new $O_2$-$BCl_3$ digital etching technique*", Phys. Status Solidi C, vol. 7, no. 7-8, pp. 2010-2012, 2010.

C. Y. Chang, S. J. Pearton, C. F. Lo, F. Ren, I. I. Kravchenko, A. M. Dabiran, A. M. Wowchak, B. Cui, and P. P. Chow, "*Development of enhancement mode AlN/GaN high electron mobility transistors*", Appl. Phys. Lett., vol. 94, no. 26, p. 263505, 2009.

H. Chen, M. Wang, and K. J. Chen, "*Self-aligned enhancement-mode AlGaN/GaN HEMTs using 25 keV fluorine ion implantation*", in Device Research Conference (DRC), 2010, pp. 137-138.

M. Eickhoff, O. Ambacher, "*Piezoresistivity of $Al_xGa_{1-x}N$ layers and $Al_xGa_{1-x}GaN$ heterostructures*", Journal of Applied Physics 90, 3383 (2001).

The invention claimed is:

1. A surface acoustic wave (SAW) radio-frequency identification (RFID) sensor chip comprising:
   (a) a piezoelectric substrate, said substrate comprising a piezoelectric layer and a multilayer heterojunction structure made of III-V single-crystalline or polycrystalline semiconductor layers, deposited on said piezoelectric layer and comprising at least one buffer layer and at least one barrier layer, said layers being stacked alternately;
   (b) at least one pair of metal interdigitated transducers (IDT) mounted on said piezoelectric substrate, for receiving a radio frequency (RF) input signal, transducing said input signal into a surface acoustic wave (SAW), propagating said surface acoustic wave along a surface of said piezoelectric substrate and transducing said propagated surface acoustic wave into an output RF signal;
   (c) at least one normally-on or normally-off two-dimensional electron gas (2DEG) or two-dimensional hole gas (2DHG) structure deposited on said piezoelectric substrate for forming a normally-on or normally-off 2DEG or 2DHG conducting channel in said multilayer heterojunction structure at the interface between said buffer layer and said barrier layer;
   (d) at least one pseudo-conducting two-dimensional electron gas (2DEG) or two-dimensional hole gas (2DHG) structure deposited on said piezoelectric substrate for forming a pseudo-conducting 2DEG or 2DHG channel in said heterojunction structure at the interface between said buffer layer and said barrier layer;
   (e) at least one (bio)molecular layer immobilised on said piezoelectric substrate within the propagating SAW path and capable of binding or adsorbing target (analyte) chemical compounds or (bio)molecules from environment; and
   (f) electrical metallizations capacitively-coupled to said IDTs, to said normally-on or normally-off 2DEG or 2DHG structures and to said pseudo-conducting 2DEG or 2DHG structures for inducing displacement currents, thereby creating nonohmic source and drain contacts, for connecting said sensor chip to an electric circuit;
characterised in that
   (i) said III-V single-crystalline or polycrystalline semiconductor materials are GaN/AlGaN; and
   (ii) said pseudo-conducting 2DEG or 2DHG structure is a semiconducting structure formed on said piezoelectric substrate by recessing or growing a top layer of said multilayer heterojunction structure to a thickness of 5-9 nm with a surface roughness of the recessed or grown top layer being 0.2 nm or less, thereby forming the pseudo-conducting 2DEG or 2DHG channel capable of conducting electric current in the current range between normally-on and normally-off operation modes of the channel.

2. The SAW RFID sensor chip of claim 1, further comprising at least one (bio)molecular layer immobilised within the open gate area of said pseudo-conducting 2DEG or 2DHG structures and capable of binding or adsorbing target (analyte) chemical compounds or (bio)molecules from the environment.

3. The SAW RFID sensor chip of claim 1, wherein said piezoelectric substrate is (i) made of zinc oxide, sapphire, aluminium nitride, lithium tantalate, lithium niobate, potassium niobate, lanthanum gallium silicate, silicon, silicon carbide or quartz; or (ii) placed on a free-standing membrane; or (iii) said free-standing membrane is made of sapphire, silicon, silicon carbide, gallium nitride or aluminium nitride.

4. The SAW RFID sensor chip of claim 1, wherein said multilayer heterojunction structure contains one GaN buffer layer at the bottom and one AlGaN barrier layer at the top, said AlGaN barrier layer having (i) thickness of 5-9 nanometres (nm), corresponding to the pseudo-conducting current range between the normally-on and normally-off operation mode of the formed 2DEG channel, and (ii) surface roughness of 0.2 nm or less.

5. The SAW RFID sensor chip of claim 4, wherein the thickness of the AlGaN barrier layer is 6-7 nm, preferably 6.2-6.4 nm, and the surface roughness of said AlGaN barrier layer is about 0.1 nm or less, preferably about 0.05 nm or less.

6. The SAW RFID sensor chip of claim 1, wherein said multilayer heterojunction structure is sandwich-like containing one GaN buffer layer at the top, one GaN buffer layer at the bottom and one AlGaN barrier layer in between, said 2DEG conducting channel being formed in the top GaN buffer layer above the AlGaN barrier layer, close to the interface between said top GaN buffer layer and said AlGaN barrier layer, thereby resulting in a N-face polarity of said structure, said top GaN buffer layer having (i) thickness of 5-9 nanometres (nm), corresponding to the pseudo-conducting current range between the normally-on and normally-off operation mode of the formed 2DEG channel, and (ii) surface roughness of 0.2 nm or less.

7. The SAW RFID sensor chip of claim 6, wherein the thickness of the top GaN buffer layer is 6-7 nm, preferably 6.2-6.4 nm, and the surface roughness of said AlGaN barrier layer is about 0.1 nm or less, preferably about 0.05 nm or less.

8. The SAW RFID sensor chip of claim 1, wherein said multilayer heterojunction structure is sandwich-like containing one GaN buffer layer at the top, one GaN buffer layer at the bottom and one AlGaN barrier layer in between, said 2DHG conducting channel being formed in the top GaN buffer layer above the AlGaN barrier layer, close to the interface between said top GaN buffer layer and said AlGaN barrier layer, thereby resulting in a Ga-face polarity of said structure, said top GaN buffer layer having (i) thickness of 5-9 nanometres (nm), which corresponds to the pseudo-conducting current range between the normally-on and normally-off operation mode of the formed 2DHG channel, and (ii) surface roughness of 0.2 nm or less.

9. The SAW RFID sensor chip of claim 8, wherein the thickness of the top GaN buffer layer is 6-7 nm, preferably 6.2-6.4 nm, and the surface roughness of said AlGaN barrier layer is about 0.1 nm or less, preferably about 0.05 nm or less.

10. The SAW RFID sensor chip of claim 1, further comprising an excitation light source for irradiating said piezoelectric substrate, thereby inducing an electric current in said 2DEG or 2DHG structure.

11. The SAW RFID sensor chip of claim 10, wherein said excitation light source is a surface-mounted-device light-emitting diode (SMD LED) or UV-VIS-IR laser diode.

12. The SAW RFID sensor chip of claim 1, wherein said metal IDTs are capable of receiving the RF signal of about 0.5-2.5 GHz and exhibiting the piezoelectric effect by creating acoustic waves over the surface of said piezoelectric substrate.

13. A sensing device, with a remote readout, for chemical detection and (bio)molecular diagnostics, comprising:
the SAW RFID sensor chip of claim 1, inserted in a sensing device frame and connected to an electric circuit;
at least one out-input SAW-RFID fractal antenna connected to said electric circuit, for receiving or transmitting a signal;
an output-input separation by delay line SAW transducer; and a remote integrated circuit for storing and processing said signal, and for modulating and demodulating a radio-frequency (RF) signals, said remote integrated circuit comprising:
a) a voltage source supplying electric current to said SAW RFID sensor and to said out-input SAW-RFID fractal antenna/s;
b) an integrated or CMOS current amplifier for amplification of an electric current obtained from said SAW RFID sensor chip;
c) an analogue-to-digital converter with wireless input/output modules connected to said current amplifier for wireless outputting the converted signal to a user interface or external memory;
d) a microcontroller unit (MCU) for processing and converting the received signal into data readable in said user interface or external memory; and
e) a wireless connection module for wireless connection of said sensing device to said user interface or external memory.

14. The sensing device of claim 13, wherein (i) said external memory is a mobile device, desktop computer, server, remote storage, internet storage or chemical/(bio) molecular diagnostics cloud; or (ii) said voltage source is a battery of the Li-ion type or energy harvester with AC-DC or DC-DC converters; or (iii) said current amplifier is connected in-line; or (iv) said wireless connection module is a short-range Bluetooth® or NFC module providing wireless communication between said sensing device and the user interface or external memory, or a Wi-Fi module providing wireless communication between said sensing device and the user interface or external memory, or a GSM module providing a worldwide wireless communication between said sensing device and the external memory.

15. A method for chemical detection and (bio)molecular diagnostics of a sample, the method comprising:
1) testing a sample via the sensing device of claim 13;
2) recording signals via the sensing device received from the sample in a form of a S21-transfer parameter dynamics of the sensing device over time with said sensing device;
3) transmitting the recorded signals from said sensing device to an external memory for further processing; and
4) converting the transmitted signals to digital signals, processing the digital signals in the external memory, correlating said S21-transfer dynamics with pre-calibrated chemical or (bio)molecular S21-transfer waveforms stored in the external memory, and extracting chemical or (bio)molecular information from said waveforms in a form of readable data, thereby detecting and/or identifying a particular chemical or biological compound (target, analyte) in the sample and measuring its concentration.

16. The method of claim 15, wherein
(i) the sample is in a gas phase or in a liquid phase; or
(ii) said chemical is:
(a) a toxic metal, such as chromium, cadmium or lead; or
(b) a regulated ozone-depleting chlorinated hydrocarbon; or
(c) a food toxin, such as aflatoxin, or shellfish poisoning toxin, such as saxitoxin or microcystin; or
(d) a neurotoxic compound, such as methanol, manganese glutamate, nitrix oxide, Botox, tetanus toxin or tetrodotoxin, oxybenzone, Bisphenol A, or butylated hydroxyanisole; or
(e) an explosive, such as picrate, nitrate, trinitro derivative, such as 2,4,6-trinitrotoluene (TNT), 1,3,5-trinitro-1,3,5-triazinane (RDX), trinitro-glycerine, N-methyl-N-(2,4,6-trinitrophenyl)nitramide (nitramine or tetryl), pentaerythritol tetranitrate (PETN), nitric ester, azide, derivate of chloric and perchloric acid, fulminate, acetylide, or nitrogen rich compound, such as tetrazene, octahydro-1,3,5,7-tetranitro-1,3,5,7-tetrazocine (HMX), peroxide, such as triacetone trioxide, C4 plastic explosives, or ozonide; or an associated compound of said explosive, such as a decomposition gas or taggant; or
(iii) said biological compound is a biological pathogen, such as a respiratory viral or bacterial pathogen, an airborne pathogen, a plant pathogen, a pathogen from infected animals or a human viral pathogens; or
(iv) said (bio)molecular layer (104) is a cyclodextrin, 2,2,3,3-tetrafluoropropyloxy-substituted phthalocyanine or derivatives thereof; or said (bio)molecular layer comprises capturing biological molecules, such as primary, secondary antibodies or fragments thereof against certain proteins to be detected, or their corresponding antigens, enzymes or their substrates, short peptides, specific nucleotide (DNA) sequences, which are complimentary to the DNA to be detected, aptamers, receptor proteins or molecularly imprinted polymers.

17. A sensing device, with a remote readout, for chemical detection and (bio)molecular diagnostics, comprising:
the SAW RFID sensor chip of claim 10, inserted in a sensing device frame and connected to an electric circuit;
a modulated light source for irradiating the surface of the pseudo-conducting 2DEG or 2DHG structures of said SAW RFID sensor chip;

optocoupler switches for coupling said modulated light source with said pseudo-conducting 2DEG or 2DHG structures of the SAW RFID sensor chip;
a voltage source connected to said electrical circuit for supplying electric current to said SAW RFID sensor chip;
a lock-in amplifier connected to said voltage source for amplification of a signal with a known carrier wave obtained from said SAW RFID sensor chip, and for increasing the signal-to-noise ratio; and
an analogue-to-digital converter (ADC) with in-built digital input/output card connected to said lock-in amplifier for outputting the converted signal to a user interface or external memory.

18. The sensing device of claim 17, wherein (i) said external memory is a mobile device, desktop computer, server, remote storage, internet storage or chemical/(bio)molecular diagnostics cloud; or (ii) said voltage source is a battery of the Li-ion type or energy harvester with AC-DC or DC-DC converters; or (iii) said modulated light source is a surface-mounted-device light-emitting diode (SMD LED) or UV-VIS-IR laser diode.

19. A method for chemical detection and (bio)molecular diagnostics of a sample, the method comprising:
1) testing a sample via the sensing device of claim 17;
2) recording signals via the sensing device received from the sample in a form of a S21-transfer parameter dynamics of the sensing device over time with said sensing device;
3) transmitting the recorded signals from said sensing device to an external memory for further processing; and
4) converting the transmitted signals to digital signals, processing the digital signals in the external memory, correlating said S21-transfer dynamics with pre-calibrated chemical or (bio)molecular S21-transfer waveforms stored in the external memory, and extracting chemical or (bio)molecular information from said waveforms in a form of readable data, thereby detecting and/or identifying a particular chemical or biological compound (target, analyte) in the sample and measuring its concentration.

20. The method of claim 19, wherein
(i) the sample is in a gas phase or in a liquid phase; or
(ii) said chemical is:
  (a) a toxic metal, such as chromium, cadmium or lead; or
  (b) a regulated ozone-depleting chlorinated hydrocarbon; or
  (c) a food toxin, such as aflatoxin, or shellfish poisoning toxin, such as saxitoxin or microcystin; or
  (d) a neurotoxic compound, such as methanol, manganese glutamate, nitrix oxide, Botox, tetanus toxin or tetrodotoxin, oxybenzone, Bisphenol A, or butylated hydroxyanisole; or
  (e) an explosive, such as picrate, nitrate, trinitro derivative, such as 2,4,6-trinitrotoluene (TNT), 1,3,5-trinitro-1,3,5-triazinane (RDX), trinitro-glycerine, N-methyl-N-(2,4,6-trinitrophenyl)nitramide (nitramine or tetryl), pentaerythritol tetranitrate (PETN), nitric ester, azide, derivate of chloric and perchloric acid, fulminate, acetylide, or nitrogen rich compound, such as tetrazene, octahydro-1,3,5,7-tetranitro-1,3,5,7-tetrazocine (HMX), peroxide, such as triacetone trioxide, C4 plastic explosives, or ozonide; or an associated compound of said explosive, such as a decomposition gas or taggant; or
(iii) said biological compound is a biological pathogen, such as a respiratory viral or bacterial pathogen, an airborne pathogen, a plant pathogen, a pathogen from infected animals or a human viral pathogens; or
(iv) said (bio)molecular layer (104) is a cyclodextrin, 2,2,3,3-tetrafluoropropyloxy-substituted phthalocyanine or derivatives thereof; or said (bio)molecular layer comprises capturing biological molecules, such as primary, secondary antibodies or fragments thereof against certain proteins to be detected, or their corresponding antigens, enzymes or their substrates, short peptides, specific nucleotide (DNA) sequences, which are complimentary to the DNA to be detected, aptamers, receptor proteins or molecularly imprinted polymers.

* * * * *